United States Patent
Taguchi et al.

(10) Patent No.: US 6,465,342 B1
(45) Date of Patent: Oct. 15, 2002

(54) SEMICONDUCTOR DEVICE AND ITS MANUFACTURING METHOD

(75) Inventors: Mitsuru Taguchi, Tokyo; Naoki Komai, Kanagawa, both of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/524,287

(22) Filed: Mar. 13, 2000

(30) Foreign Application Priority Data

Mar. 17, 1999 (JP) .......................................... 11-071297

(51) Int. Cl.$^7$ ...................... H01L 21/4763; H01L 21/44
(52) U.S. Cl. ...................... 438/623; 438/624; 438/643; 438/644; 438/687; 438/688
(58) Field of Search ................................. 438/623, 643, 438/624, 644, 687, 688

(56) References Cited

U.S. PATENT DOCUMENTS 6,184,121 B1 * 2/2001 Buchwalter et al. ........ 438/622

* cited by examiner

Primary Examiner—Olik Chaudhuri
Assistant Examiner—Erik Kielin
(74) Attorney, Agent, or Firm—Ronald P. Kananen, Esq.; Rader, Fishman & Grauer PLLC

(57) ABSTRACT

The object of the invention is to solve failure in embedding conductive material by electroplating caused because organic insulating material is deformed by the compressive stress of a barrier metal layer such as tantalum nitride used for grooved interconnection, a groove-used for grooved interconnection is deformed and a seed layer is not fully formed in the groove and to enhance reliability upon interconnection. To achieve the object, a semiconductor device according to the invention is based upon a semiconductor device having a groove formed through a second insulating film over a substrate, a barrier metal layer formed at least on the inner wall of the groove and grooved interconnection embedded inside the groove via the barrier metal layer and is characterized in that a concave portion is continuously or intermittently formed along a groove through a second insulating film within a predetermined interval from grooved interconnection.

13 Claims, 12 Drawing Sheets

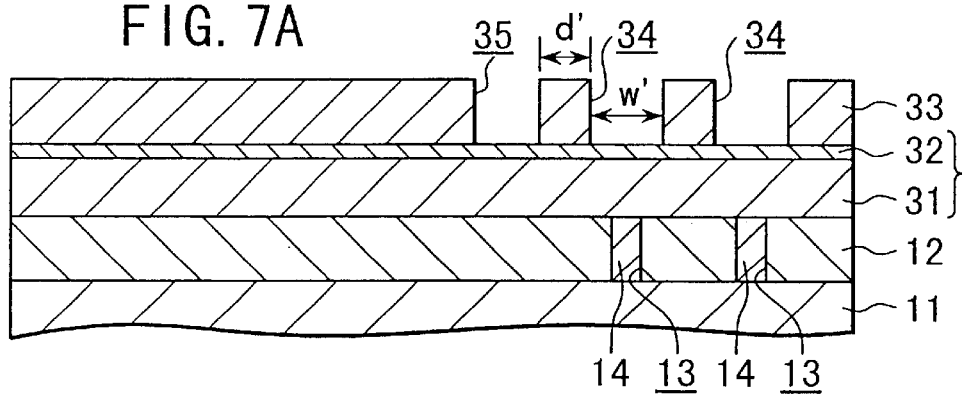
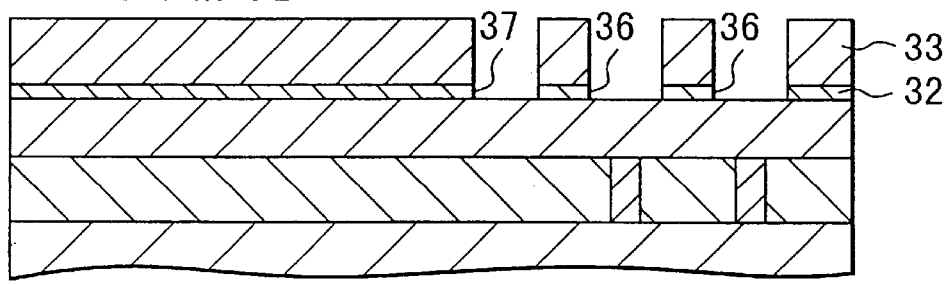
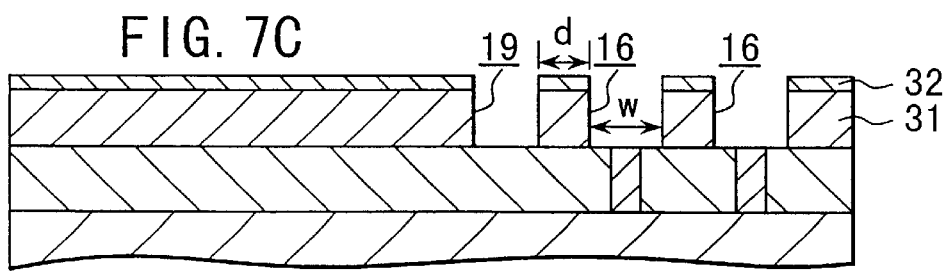
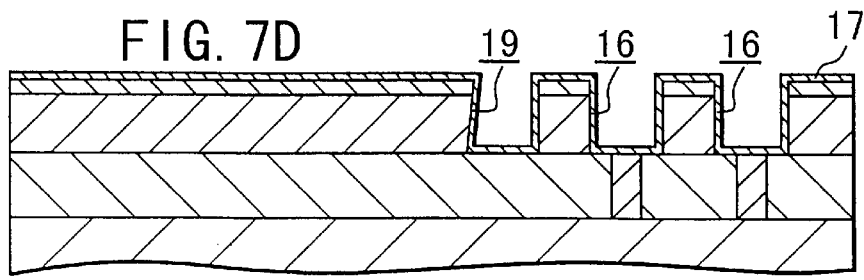
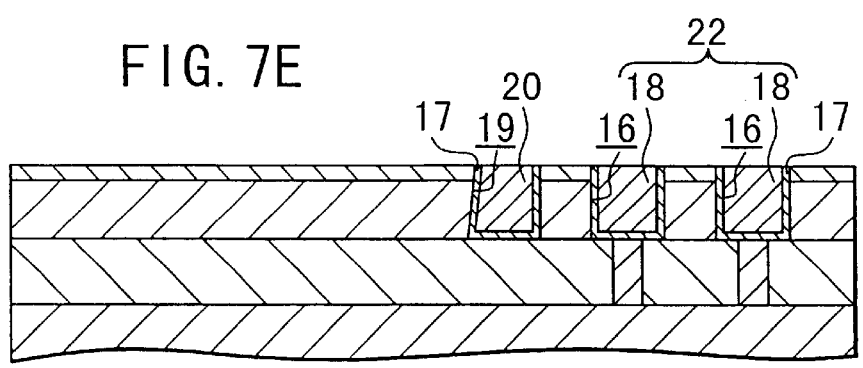

SEMICONDUCTOR DEVICE AND ITS MANUFACTURING METHOD

BACKGROUND OF THE INVENTION

1. Field of the Invention

The present invention relates to a semiconductor device and its manufacturing method and more particularly to a semiconductor device and its manufacturing method wherein the deformation of a groove for interconnection by the compressive stress of a barrier metal layer used for an interconnection in a groove (hereinafter called grooved interconnection) having a single damascene structure or a dual damascene structure is prevented.

2. Description of Related Art

The reduction of the resistance of an interconnection and the reduction of the dielectric constant of an interlayer insulating film are desired to meet requests for the miniaturization and speedup of an LSI device. To meet the desire, a copper interconnection lower in electrical resistance, compared with conventional type aluminum alloy interconnection and various organic insulating films lower in a dielectric constant, compared with a conventional type silicon oxide ($SiO2$) film are examined for actual use.

For technology for forming a copper interconnection, as the dry etching of copper is generally not easy, a method by a so-called grooved interconnection is considered promising. For technology for forming the grooved interconnection, 1) a method of forming an insulating film between interconnection on an interlayer insulating film after embedding interconnection material in a contact hole formed through the interlayer insulating film and embedding interconnection material in a groove after forming the groove on the insulating film (a so-called single damascene method) and 2) a method of simultaneously embedding interconnection material in both a contact hole and a groove after forming both the contact hole and the groove through/on an interlayer insulating film (a so-called dual damascene method) are proposed.

For a method of embedding copper as an interconnection material in a groove and a contact hole, electroplating relatively satisfactory in embeddability and the quality of a film which is a low-temperature process under approximately room temperature is promising. Particularly, it is advantageous in case organic insulating material low in heat resistance is used for an insulating film that electroplating is a low-temperature process.

In the meantime, copper as an interconnection material has a character diffused inside an insulating film. Therefore, to form a copper grooved interconnection, a barrier metal layer is required to be formed between copper and the insulating film. For a barrier metal, tantalum, titanium nitride and tungsten nitride are promising in addition to tantalum nitride used heretofore.

FIG. 13 shows an example that copper grooved interconnection is formed using organic insulating material. As shown in FIG. 13, an organic insulating material film 112 is formed on a silicon oxide film 111 and a groove 113 is formed on the organic insulating material film 112. Grooved interconnection 115 made of copper is formed inside the groove 113 via a barrier metal layer 114 made of tantalum nitride. When the groove 113 is formed by etching, the silicon oxide film 111 functions as an etching stopper. Therefore, the groove 113 is formed in only the organic insulating material film 112 on the silicon oxide film 111 and the bottom of the groove 113 is on the silicon oxide film 111.

However, as for the grooved interconnection, in case tantalum nitride is used for barrier metal, a problem that the organic insulating material film is deformed by the compressive stress of the tantalum nitride is found. It proves that the deformation is often caused particularly in isolated grooved interconnection or grooved interconnection in close formation (for example, grooved interconnection at the end of a line and space). The reason is that though mechanical strength is weak because organic insulating material is generally small in an elastic modulus and is also low in an elastic limit, barrier metal such as tantalum nitride generally has very high compressive stress.

That is, as shown in FIG. 14A, it is considered that the groove 113 is easily deformed inside because the compressive stress of the barrier metal layer 114 particularly made of tantalum nitride widely deposited in an area having no grooved interconnection concentrates at the corner 113C of the outside groove 113. It is also considered that the deformation of the groove 113 is promoted because adhesion between the organic insulating material film 112 and the silicon oxide film 111 under the organic insulating material film is not sufficient and sliding occurs between the organic insulating material film 112 and the silicon oxide film 111 by stress concentrating at an interface between the organic insulating material film 112 and the silicon oxide film 111.

As shown in FIG. 14B, as a copper seed layer is not fully deposited in the formation of a film by later sputtering in the groove 113 deformed as described above, failure in embedding copper occurs in electroplating for forming the grooved interconnection 115. That is, a void B is made in the grooved interconnection 115.

SUMMARY OF THE INVENTION

The present invention is made to solve the problems and the object is to provide a semiconductor device and its manufacturing method respectively free of the problems.

A semiconductor device according to the invention is based upon a semiconductor device having a groove formed through an insulating film made of organic material on a substrate, a barrier metal layer formed on at least the inner wall of the groove and a grooved interconnection embedded inside the groove via the barrier metal layer and is characterized in that a concave portion is formed through an insulating film around the grooved interconnection. The concave portion is continuously or intermittently formed along the groove within a predetermined interval from the groove. Or the groove is arranged at the end of a group of grooves composed of plural grooves respectively arranged at a predetermined interval and the concave portion is continuously or intermittently formed along the groove within a predetermined interval outside the group of grooves from the groove arranged at the end of the group of grooves.

In the semiconductor device, a barrier metal layer is formed on the inner wall of the groove. Normally, it is difficult to selectively form a barrier metal layer only inside a groove formed through an insulating film because of a characteristic in forming a film and the barrier metal layer is formed not only inside the groove but also on the insulating film. Afterward, in a process for forming a grooved interconnection, a surplus barrier metal layer on the insulating film is removed; however, when a concave portion is formed through the insulating film, the barrier metal layer may be left inside the concave portion. In the invention, in such a semiconductor device, as a concave portion is formed through an insulating film around the grooved interconnection, a barrier metal layer is formed not only inside a groove in which the grooved interconnection is formed but also on the surface of the insulating film and inside the concave portion when the barrier metal layer is formed. Therefore, as compressive stress of the barrier metal layer is relaxed by the concave portion and the large compressive stress of the barrier metal layer is not applied to the groove in which the grooved interconnection is formed, the deformation of the groove is inhibited.

Also, in case the barrier metal layer formed on the inner wall of the groove is also formed on the surface of the insulating film, it is inhibited that the large compressive stress of the barrier metal layer concentrates at the groove because the concave portion is continuously or intermittently formed along the groove within a predetermined interval from the groove. For example, if an interval between the concave portion and the groove is approximately within 20 times of the width of the groove, the interval is enough to inhibit the concentration of the compressive stress of the barrier metal layer. Or in case a groove is arranged at the end of a group of grooves composed of plural grooves respectively arranged at a predetermined interval and a concave portion is continuously or intermittently formed along the groove within a predetermined interval outside the group of grooves from the groove arranged at the end of the group of grooves, it is also inhibited as described above that the large compressive stress of a barrier metal layer concentrates at the groove.

A first manufacturing method according to the invention is based upon a method of manufacturing a semiconductor device having a process for forming a groove through an insulating film made of organic material on a substrate, a process for forming a barrier metal layer at least on the inner wall of the groove, a process for embedding conductive material inside the groove via the barrier metal layer and a process for removing surplus conductive material and a surplus barrier metal layer on the insulating film, and is characterized in that when a groove is formed through an insulating film, a concave portion is formed around the groove.

Also, the first manufacturing method according to the invention is characterized in that when the barrier metal layer is formed on the insulating film, the concave portion is continuously or intermittently formed along the groove within a predetermined interval which between the concave portion and the groove keeps the shape of the groove.

Or the first manufacturing method according to the invention is characterized in that a groove is set as the one provided at the end of a group of grooves composed of plural grooves respectively arranged at a predetermined interval and when a barrier metal layer is formed on an insulating film, a concave portion is continuously or intermittently formed along the groove provided at the end of the group of grooves within a predetermined interval which between the concave portion and the groove provided at the end of the group of grooves keeps the shape of the groove provided at the end of the group of grooves.

According to the first manufacturing method, as compressive stress of the barrier metal layer formed on the insulating film is relaxed by the concave portion when afterward, the barrier metal layer is formed because the concave portion is formed around the groove when the groove is formed through the insulating film, the deformation of the groove by the compressive stress of the barrier metal layer is inhibited. As a result, conductive material is satisfactorily embedded without making a void in the groove.

Also, as the concave portion is continuously or intermittently formed along the groove within a predetermined interval which between the concave portion and the groove keeps the shape of the groove when the barrier metal layer is formed on the insulating film, the groove is prevented from being deformed by the compressive stress of the barrier metal layer formed between the groove and the concave portion. In other words, the barrier metal layer between the groove and the concave portion does not have compressive stress enough to deform the groove. Therefore, even if the compressive stress of the barrier metal layer concentrates at the groove, the groove is not deformed. For example, in case an interval between the concave portion and the groove is within 20 times of the width of the groove, normally the compressive stress of the barrier metal layer between them is not enough to deform the groove. The reason is that the compressive stress of the barrier metal layer between the groove and the concave portion is relaxed because compressive stress of the barrier metal layer formed in a large area on the insulating film concentrates at the concave portion. As a result, the deformation of the groove is inhibited. As a further result, conductive material is satisfactorily embedded without making a void in the groove.

In case an interval between the concave portion and the groove exceeds 20 times the width of the groove, the groove is deformed by the compressive stress of the barrier metal layer formed on the insulating film between them. Therefore, an interval between the concave portion and the groove is required to be set within 20 times of the width of the groove.

Or as also in a method of setting a groove as the one provided at the end of a group of grooves composed of plural grooves respectively arranged at a predetermined interval and continuously or intermittently forming a concave portion along the groove at the end of the group of grooves within a predetermined interval which between the concave portion and the groove provided at the end of the group of grooves keeps the shape of the groove at the end of the group of grooves when a barrier metal layer is formed on an insulating film, the barrier metal layer between the groove at the end and the concave portion does not have compressive stress enough to deform the groove at the end, the groove at the end is never deformed even if the compressive stress of the barrier metal layer concentrates at the groove at the end. For example, in case an interval between the concave portion and the groove at the end is within 20 times of the width of the groove, normally the compressive stress of the barrier metal layer between them is not enough to deform the groove at the end. The reason is that the compressive stress of the barrier metal layer between the groove at the end and the concave portion is relaxed because compressive stress of the barrier metal layer formed in a large area on a second insulating film concentrates at the concave portion and as a result, the deformation of the groove at the end is inhibited. As a result, conductive material is satisfactorily embedded without making a void in the groove at the end.

A second manufacturing method according to the invention is based upon a method of manufacturing a semiconductor device having a process for forming a first insulating film on a substrate, a process for forming a contact hole through the first insulating film, a process for forming a second insulating film made of organic material on the first insulating film, embedding the organic material in the contact hole, a process for forming a groove through the second insulating film and forming a contact hole again, a process for forming a barrier metal layer at least on each inner wall of the groove and the contact hole, a process for embedding conductive material inside the groove and the contact hole via the barrier metal layer and a process for removing surplus conductive material on the second insulating film and a surplus barrier metal layer, and is characterized in that when a contact hole is formed through a first insulating film, a first concave portion is formed through the first insulating film in a position apart by predetermined distance from the contact hole around a part located under a groove formed through a second insulating film and when the second insulating film is formed, a second concave portion is formed on the surface of the second insulating film on the first concave portion.

Also, the second manufacturing method according to the invention is characterized in that when a barrier metal layer is formed on the second insulating film, the second concave portion is continuously or intermittently formed along the groove within a predetermined interval which between the second concave portion and the groove keeps the shape of the groove.

The second manufacturing method according to the invention is characterized in that a groove is set as the one provided at the end of a group of grooves composed of plural grooves respectively arranged at a predetermined interval. When the barrier metal layer is formed on the second insulating film, the second concave portion is continuously or intermittently formed along the groove arranged at the end of the group of grooves within a predetermined interval which between the second concave portion and the groove provided at the end of the group of grooves keeps the shape of the groove provided at the end of the group of grooves.

According to the second manufacturing method, as the first concave portion is formed through the first insulating film in a position apart from the contact hole by predetermined distance around a part located under the groove formed through the second insulating film when the contact hole is formed through the first insulating film and the second concave portion is formed on the surface of the second insulating film on the first concave portion when the second insulating film is formed, compressive stress of the barrier metal layer is relaxed by the second concave portion when afterward, the barrier metal layer is formed and it is inhibited that the groove is deformed by the compressive stress of the barrier metal layer. As a result, conductive material is satisfactorily embedded without making a void in the groove.

Also, as the second concave portion is continuously or intermittently formed along the groove within a predetermined interval which between the second concave portion and the groove keeps the shape of the groove when the barrier metal layer is formed on the second insulating film, the groove is not deformed with the compressive stress of the barrier metal layer formed between the groove and the second concave portion. In other words, the barrier metal layer between the groove and the second concave portion does not have compressive stress enough to deform the groove. Therefore, even if the compressive stress of the barrier metal layer concentrates at the groove, the groove is not deformed. For example, in case an interval between the second concave portion and the groove is within 20 times of the width of the groove, normally the compressive stress of the barrier metal layer between them is not enough to deform the groove. The reason is that as compressive stress of the barrier metal layer formed in a large area on the second insulating film concentrates at the second concave portion, the compressive stress of the barrier metal layer between the groove the concave portion is relaxed and as a result, the deformation of the groove is inhibited. As a result, conductive material is satisfactorily embedded without making a void in the groove.

As also in a method of setting a groove as the one provided at the end of a group of grooves composed of plural grooves respectively arranged at a predetermined interval and continuously or intermittently forming a second concave portion along the groove at the end of the group of grooves within a predetermined interval which between the concave portion and the groove provided at the end of the group of grooves keeps the shape of the groove at the end of the group of grooves when a barrier metal layer is formed on a second insulating film, the barrier metal layer between the groove at the end and the second concave portion does not have compressive stress enough to deform the groove at the end, the groove at the end is never deformed even if the compressive stress of the barrier metal layer concentrates at the groove at the end. For example, in case an interval between the second concave portion and the groove at the end is within 20 times of the width of the groove, normally the compressive stress of the barrier metal layer between them is not enough to deform the groove at the end. The reason is that the compressive stress of the barrier metal layer between the groove at the end and the second concave portion is relaxed because compressive stress of the barrier metal layer concentrates at the second concave portion and as a result, the deformation of the groove at the end is inhibited. As a result, conductive material is satisfactorily embedded without making a void in the groove at the end.

In case an interval between the second concave portion and the groove at the end exceeds 20 times of the width of the groove, the groove at the end is deformed by compressive stress of the barrier metal layer formed on the second insulating film between the second concave portion and the groove at the end. Therefore, an interval between the second concave portion and the groove at the end is required to be within 20 times of the width of the groove.

BRIEF DESCRIPTION OF THE DRAWINGS

FIGS. 7A to 7E are a process drawing showing the first embodiment by a first manufacturing method according to the invention;

DETAILED DESCRIPTION OF THE PREFERRED EMBODIMENTS

First Embodiment

Referring to a schematic block diagram shown in FIG. 1, a first embodiment of a semiconductor device according to the invention will be described below.

Figure 1:
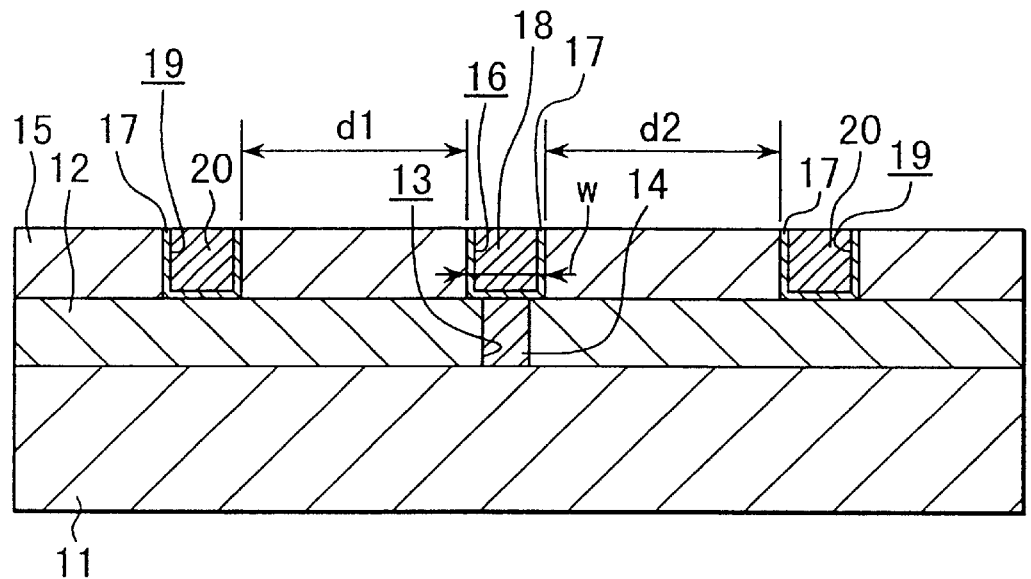
FIG. 1 is a schematic block diagram showing a first embodiment of a semiconductor device according to the invention.

As shown in FIG. 1, a contact hole 13 is formed through a first insulating film 12 that covers a semiconductor device such as a transistor formed on a substrate 11 and a plug 14 formed by embedding conductive material inside the contact hole 13 is provided. Further, a second insulating film 15 is formed on the first insulating film 12 in a state covering the plug 14. The second insulating film 15 is made of organic material, for example an organic film having a low dielectric constant such as polyallylether.

A groove 16 the bottom of which is touched to the plug 14 is formed through the second insulating film 15, dielectric material such as copper is embedded in the groove 16 via a barrier metal layer 17 and grooved interconnection 18 is formed. The barrier metal layer 17 is formed by a tantalum nitride film for example. The grooved interconnection 18 is an isolated grooved interconnection and an interval between the grooved interconnection and adjacent grooved interconnection not shown is set so that the interval is longer than 20 times of the width of the groove 16.

Further, a concave portion 19 that functions as a dummy groove is formed in a position where distance d1 from the grooved interconnection 18 is within 20 times of the width w of the groove 6 through the second insulating film 15. The concave portion 19 is a so-called dummy groove that never contributes as the interconnection of the device and is formed at least before the barrier metal layer 17 is formed. In FIG. 1, the concave portion 19 is formed on both sides of the groove 16 so that each interval d1, d2 between each concave portion and the groove 16 is within 20 times of the width w of the groove 16. The concave portion 19 is continuously formed along the grooved interconnection 18, however, for example, it may be also intermittently formed along the grooved interconnection 18. In that case, an interval between the concave portions is set to an interval at which the groove 16 is not deformed by the compressive stress of the barrier metal layer 17, for example an interval substantially equal to the width of the groove.

For the convenience of a process, copper is also embedded in the concave portion 19 via the barrier metal layer 17 as in the groove 16 and dummy interconnection 20 is formed. The dummy interconnection 20 does not function as the interconnection of the device and has no bad effect upon another device and interconnection.

As described above, the barrier metal layer 17 is formed on the inner wall of the groove 16. Normally, it is difficult to selectively form the barrier metal layer 17 only inside the groove 16 formed through the second insulating film 15 because of a characteristic in forming a film and the barrier metal layer 17 is also formed not only on the inner wall of the groove 16 but on the second insulating film 15.

Afterward, in the process for forming a grooved interconnection, a surplus barrier metal layer on the second insulating film 15 is removed. When the concave portion 19 is formed through the second insulating film 15, copper deposited for forming the barrier metal layer 17 and interconnection is left inside the concave portion 19 as shown in FIG. 1 depending upon a removing method.

In the first embodiment, in case the barrier metal layer 17 formed on the inner wall of the groove 16 is formed on the surface of the second insulating film 15 because the concave portion 19 is continuously or intermittently formed through the second insulating film 15 along the groove 16 within a predetermined interval from the groove 16, large compressive stress possessed by the barrier metal layer 17 formed in a part having a large area 15A of the second insulating film 15 is interrupted by the concave portion 19. If each interval d1, d2 between the concave portion 19 and the groove 16 is approximately within 20 times of the width w of the groove 16 even if the barrier metal layer 17 is formed on the second insulating film 15 between the concave portion 19 and the groove 16, the barrier metal layer 17 between them has no large compressive stress such as deforms the shape of the groove 16. Therefore, in the structure described in relation to the first embodiment, it is inhibited, compared with the conventional type structure of grooved interconnection that the large compressive stress of the barrier metal layer 17 concentrates in the groove 16.

Therefore, as compressive stress which the barrier metal layer 17 has is relaxed by the concave portion 19 because the concave portion 19 is formed and the large compressive stress of the barrier metal layer 17 is not applied to the groove 16 in which the grooved interconnection 18 is formed, the deformation of the groove 16 is inhibited. Therefore, the grooved interconnection 18 becomes reliable without a void.

Second Embodiment

Figure 2:
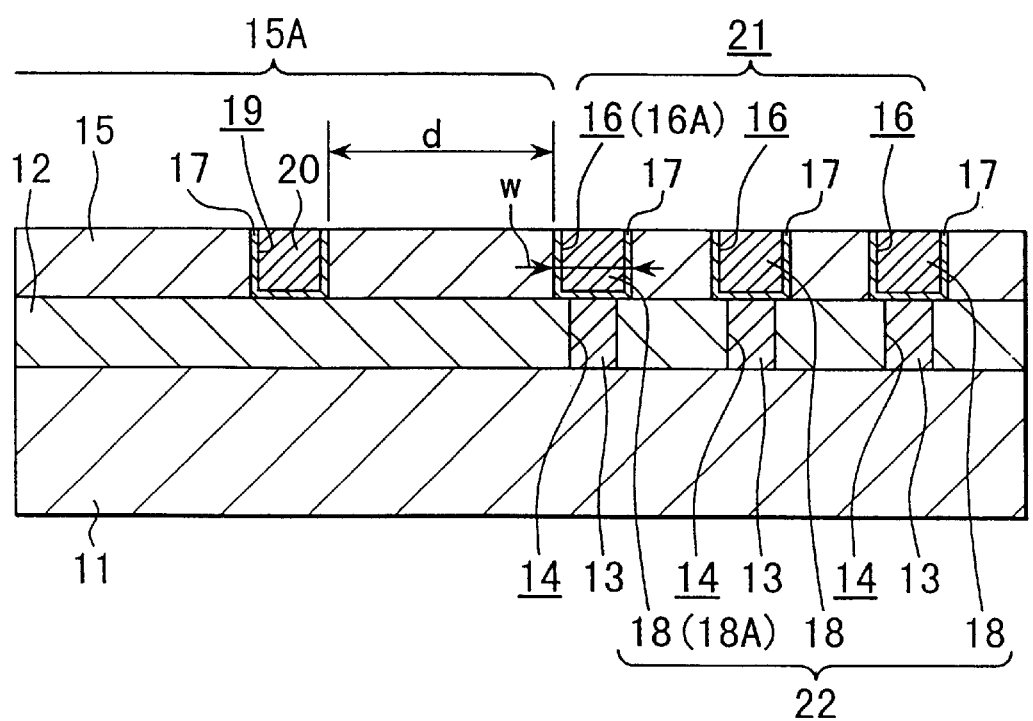
FIG. 2 is a schematic block diagram showing a second embodiment of the semiconductor device according to the invention.

Next, referring to the schematic block diagram shown in FIG. 2, a second embodiment of the semiconductor device according to the invention will be described. In FIG. 2, the same reference number is allocated to the similar component to that described referring to FIG. 1.

As shown in FIG. 2, plural contact holes 13 are formed through a first insulating film 12 covering a semiconductor device such as a transistor formed on a substrate 11 and a plug 14 formed by embedding conductive material is provided inside each contact hole 13. Further, a second insulating film 15 is formed on the first insulating film 12 in a state covering each plug 14.

A group of grooves 21 composed of plural grooves 16 the bottom of which are touched to the plug 14 are formed through the second insulating film 15. The grooves included in the group of grooves 21 are formed at an equal interval for example. Grooved interconnection 18 is embedded in each groove 16 via a barrier metal layer 17 and composes a group 22 of grooved interconnections. Therefore, the group of grooved interconnections 22 forms a so-called line and space. An interval between the group of grooved interconnections 22 and an adjacent grooved interconnection not shown, that is, an interval between grooved interconnection 18 (18A) at the end of the group of grooved interconnection 22 and the adjacent grooved interconnection not shown is set so that the interval is longer than 20 times of the width w of the groove 16.

Further, a concave portion 19 as a dummy groove is formed at distance d from the groove 16A where the grooved interconnection 18A is formed outside the group of grooves 21 and in which an interval between the concave portion and the groove 16A is within 20 times of the width w of the groove 16 through the second insulating film 15. The concave portion 19 is a so-called dummy groove that never contributes to a grooved interconnection and is formed at least before the barrier metal layer 17 is formed. The concave portion 19 is continuously formed along the grooved interconnection 16A; however, for example, it may be also intermittently formed along the grooved interconnection 16A. In that case, an interval between concave portions is an interval at which the groove 16 is not deformed by the compressive stress of the barrier metal layer 17, for example an interval substantially equal to the width of the groove.

For the convenience of a process, copper is also embedded in the concave portion 19 via the barrier metal layer 17 as in the groove 16 and dummy interconnection 20 is formed. The dummy interconnection 20 does not contribute to the interconnection of the device.

As described above, the barrier metal layer 17 is formed on the inner wall of each groove 16. Normally, it is difficult to selectively form the barrier metal layer 17 only inside each groove 16 formed through the second insulating film 15 because of a characteristic in forming a film and the barrier metal layer 17 is also formed not only on the inner wall of each groove 16 but on the second insulating film 15. Afterward, in the process for forming a grooved interconnection, a surplus barrier metal layer on the second insulating film 15 is removed; however, when the concave portion 19 is formed through the second insulating film 15, the barrier metal layer 17 may be left inside the concave portion 19 depending upon a removing method.

In the second embodiment, in case the barrier metal layer 17 formed on the inner wall of each groove 16 is formed on the surface of the second insulating film 15 because the concave portion 19 is continuously or intermittently formed at distance d within a predetermined interval from the groove 16 (16A) at the end of the group of grooves 21 through the second insulating film 15 along the groove 16A, large compressive stress of the barrier metal layer 17 formed in a part having a large area 15A of the second insulating film 15 is interrupted by the concave portion 19. If an interval between the concave portion 19 and the groove 16A is within 20 times for example of the width w of the groove even if the barrier metal layer 17 is formed on the second insulating film 15 between the concave portion 19 and the groove 16A, the barrier metal layer 17 between them has no large compressive stress such as deforms the shape of the groove 16A. Therefore, in structure in the second embodiment, it is inhibited, compared with the conventional type structure of grooved interconnection that the large compressive stress of the barrier metal layer 17 concentrates in the groove 16A. Also, as an interval between the other respective grooves 16 included in the group of grooves 21 except the groove 16A is within 20 times of the width of the groove, the grooves are never deformed by a compressive stress of the barrier metal layer 17 formed on the second insulating film 15 between the grooves.

Therefore, as compressive stress of the barrier metal layer 17 is relaxed by the concave portion 19 because the concave portion 19 is formed and the large compressive stress of the barrier metal layer 17 is not applied to the groove 16A in which the grooved interconnection 18A is formed, the deformation of the groove 16A is inhibited. Therefore, the grooved interconnection 18A arranged at the end of the group of grooved interconnection 22 becomes reliable without a void.

Next, one example in which the concave portion for relaxing the compressive stress of the barrier metal layer is arranged will be described below.

Figure 3A:
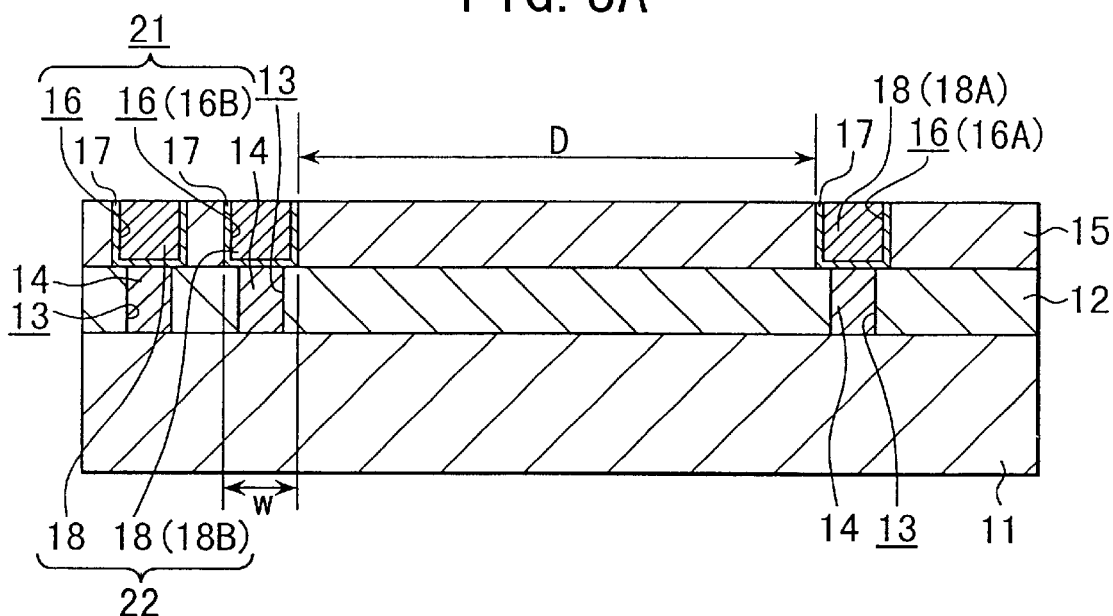
FIGS. 3A to 3C are explanatory drawings showing the arrangement of a concave portion for relaxing the compressive stress of a barrier metal layer.

As shown in FIG. 3A, plural contact holes 13 are formed through the first insulating film 12 covering the semiconductor device such as a transistor formed on the substrate 11 and a plug 14 formed by embedding conductive material is provided inside each contact hole 13. Further, the second insulating film 15 is formed on the first insulating film 12 in a state covering each plug 14.

A group of grooves 21 composed of plural grooves 16 and an isolated groove 16 (16A) are formed through the second insulating film 15, grooved interconnection 18 is formed in each groove 16 included in the group of grooves 21 via the barrier metal layer 17 and composes the group of grooved interconnections 22. In the meantime, grooved interconnection 18 (18A) is formed in the groove 16A via the barrier metal layer 17. Further, an interval D between the groove 16B closest to the groove 16A of the group of grooves 21 and the groove 16A is set so that the interval is longer than 20 times of the width w of the groove 16.

Figure 3B:
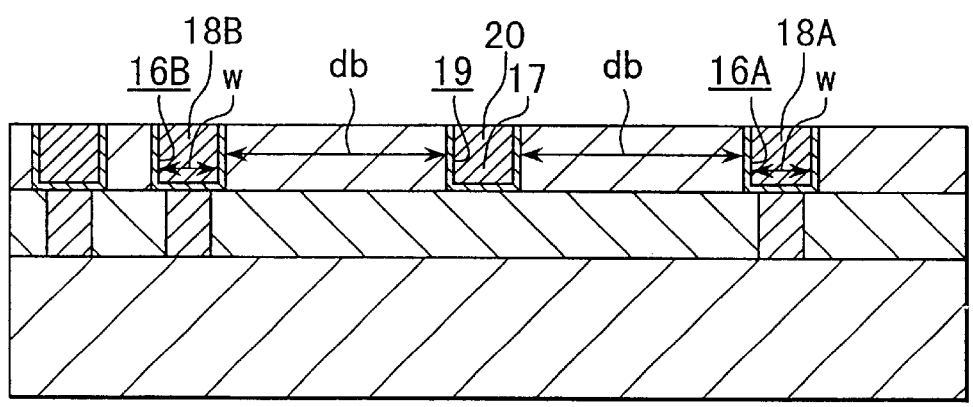

In the grooved interconnection having the configuration described above, as shown in FIG. 3B, a concave portion 19 as a dummy groove is formed between the groove 16A in which the grooved interconnection 18A is formed and the groove 16B in which grooved interconnection 18B is formed so that an interval da between the concave portion and the groove 16A and an interval db between the concave portion and the groove 16B are both within 20 times of the width w of the groove 16. The concave portion 19 is formed at least before the barrier metal layer 17 is formed as described above and dummy interconnection 20 is formed inside via the barrier metal layer 17.

Figure 3C:
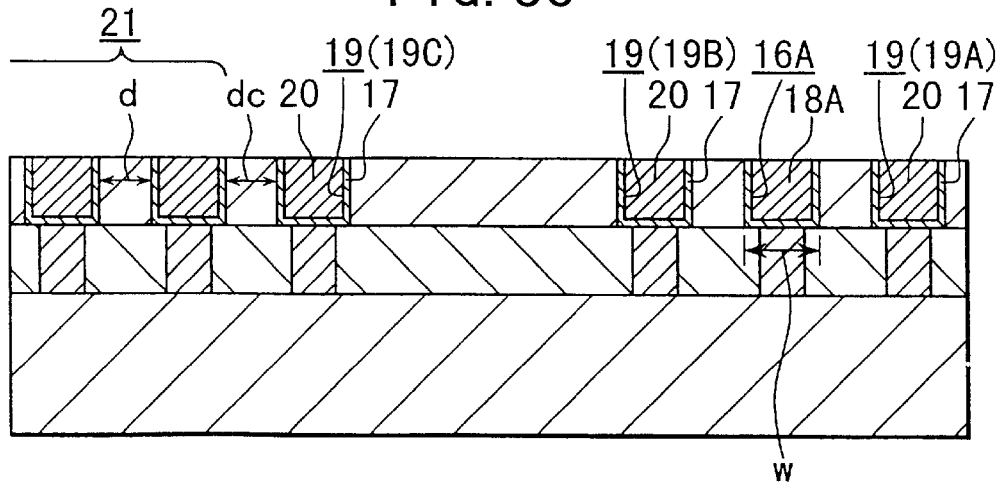

As shown in FIG. 3C, concave portions 19 (19A) and 19 (19B) are formed on both sides of the groove 16A in which the grooved interconnection 18A is formed at an interval within 20 times of the width w of the groove 16, for example at an interval forming a line and space including the grooved interconnection 18A, Dummy interconnection 20 is formed inside each concave portion 19 via the barrier metal layer 17.

In the meantime, a concave portion 19 (19C) as a dummy groove is formed at the similar interval dc to an interval d between the grooves composing the group of grooves 21 for example on the side of the groove 16A from the group of grooves 21. Dummy interconnection 20 is also formed inside the concave portion 19C via the barrier metal layer 17. Each concave portion 19 is formed at least before the barrier metal layer 17 is formed as described above.

Next, referring to FIGS. 4, an example in which two isolated grooved interconnections are formed will be described.

Figure 4A:
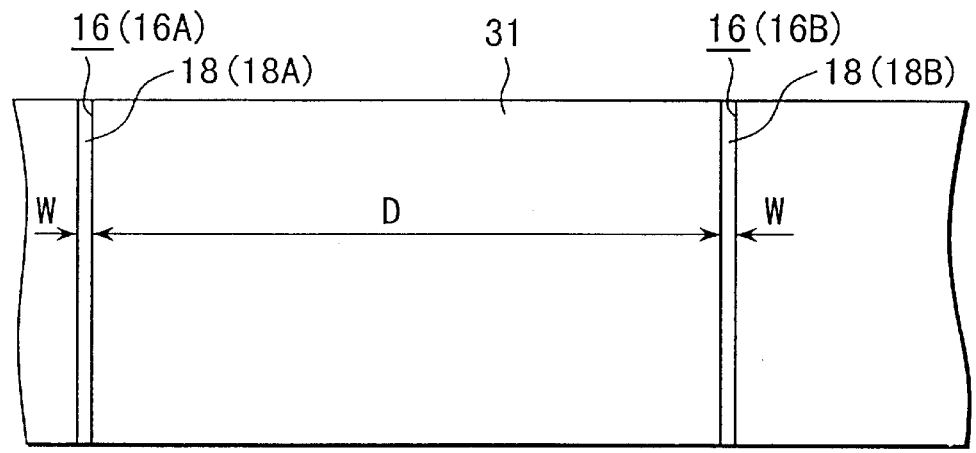
FIGS. 4A to 4C are explanatory drawings showing the arrangement of a concave portion for relaxing the compressive stress of the barrier metal layer.
Figure 4B:
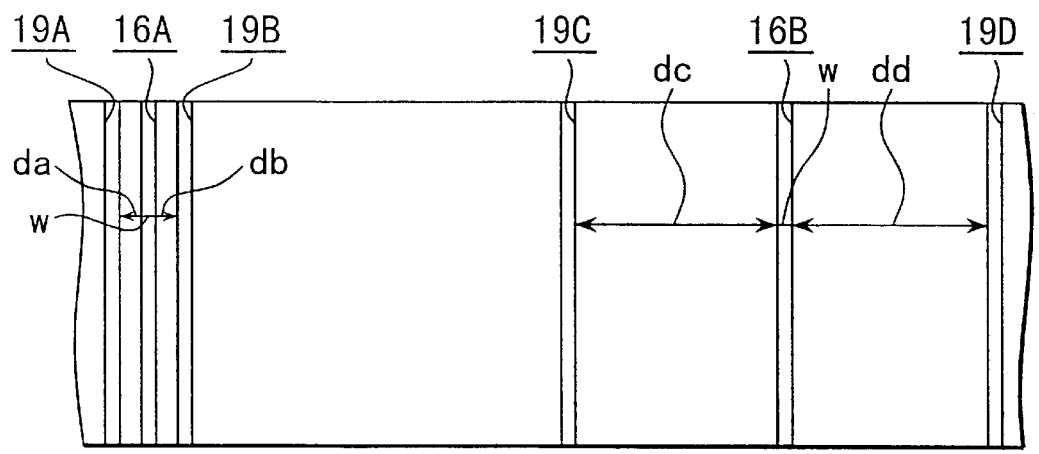

As shown in FIG. 4A, an isolated groove 16 (16A) and an isolated groove 16 (16B) are formed through an insulating film 31 at an interval D longer than 20 times of the width w of the groove 16. Grooved interconnection 18 (18A) and 18 (18B) are embedded inside each groove 16A, 16B via the barrier metal layer not shown.

As for the grooved interconnection having the configuration described above, as shown in FIG. 4B, for example, concave portions 19A and 19B as a dummy groove are formed on both sides of one isolated groove 16A so that each interval da, db between each concave portion and the groove 16A is within 20 times of the width w of the groove 16 and so that for example, a line and space including the grooved interconnection 18A having an approximately equal interval is formed. A concave portion 19C as a dummy groove is formed on one side of the other isolated groove 16B so that an interval dc between the concave portion and the groove 16B is within 20 times of the width of the groove 16. In addition, a concave portion 19D as a dummy groove is formed on the other side of the groove 16B so that an interval dd between the concave portion and the groove 16B is within 20 times of the width w of the groove 16. Each concave portion 19A, 19B, 19C, 19D is formed at least before the barrier metal layer not shown is formed as described above and dummy interconnection 20 is formed inside each via the barrier metal layer not shown.

If distance between the concave portion 19 and each groove 16A, 16B is within 20 times of the width of the groove 16 in case the interval D between the grooves 16A and 16B is within 40 times of the width of the groove 16, one concave portion has only to be formed between the grooves 16A and 16B.

Figure 4C:
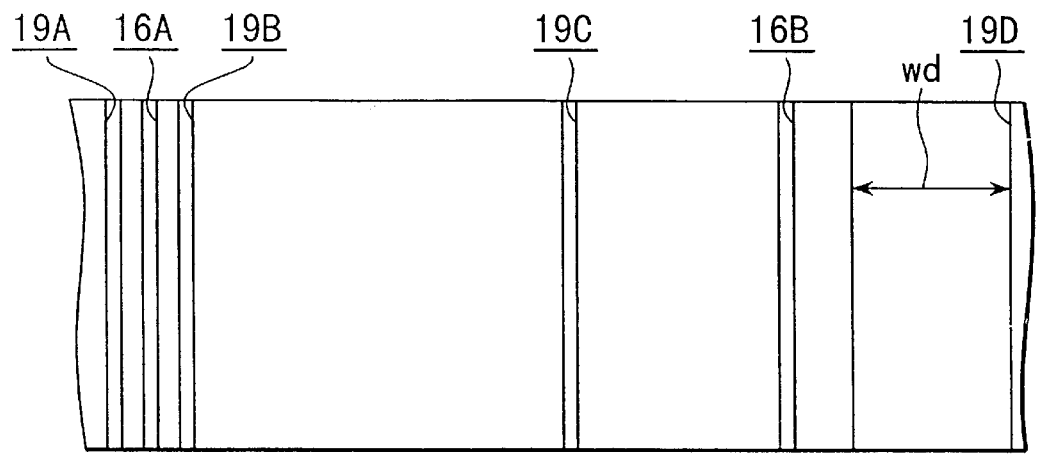

Or as shown in FIG. 4C, for example, the concave portion 19D can be also formed so that it has wider width Wd than the width of the other concave portions 19A, 19B and 19C of the concave portions 19A to 19D provided on both sides of each groove 16A, 16B.

Next, referring to FIG. 5, an example that a group of grooved interconnections in which plural grooved interconnections are arranged at a predetermined interval is formed at a predetermined interval will be described.

Figure 5A:
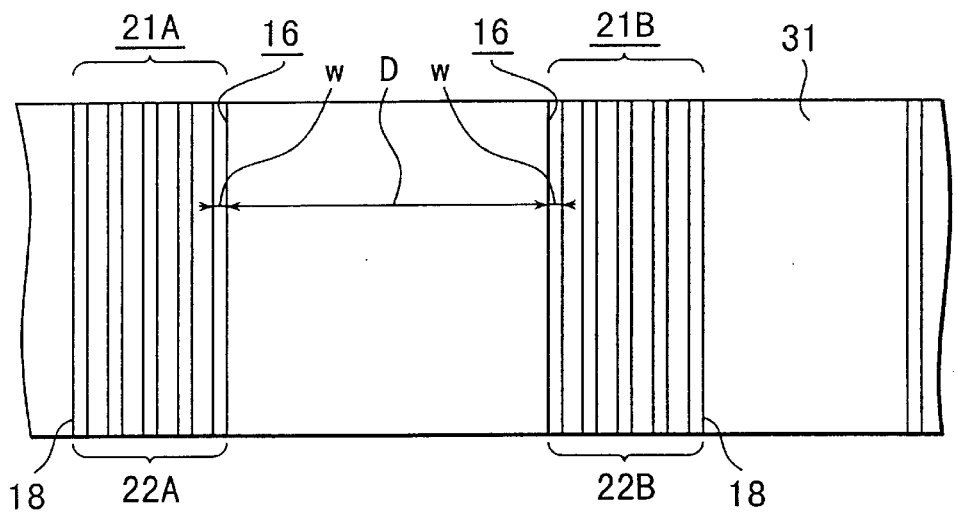
FIGS. 5A to 5C are explanatory drawings showing the arrangement of a concave portion for relaxing the compressive stress of the barrier metal layer.

As shown in FIG. 5A, a group of grooves 21A in which plural grooves 16 are arranged at a predetermined interval (so-called line and space) and a group of grooves 21B in which plural grooves 16 are arranged at a predetermined interval (so-called line and space) are formed at a predetermined interval D, for example, apart by a longer distance than 20 times of the width w of the groove 16 through an insulating film 31. Grooved interconnection 18 is formed via the barrier metal layer (not shown) inside each groove 16 included in the group of grooves 21A and inside each groove 16 included in the group of grooves 21B and composes a group of grooved interconnections 22A and a group of grooved interconnections 22B.

As for the grooved interconnection having the configuration described above, as shown in FIG. 5B, concave portions 19A and 19B are provided on both sides of the group of grooves 21A so that an interval da between the concave portion and the groove 16A on one side composing the group of grooves 21A and an interval db between the concave portion and the groove 16B on the other side are within 20 times of the width w of the groove 16, for example so that the intervals are an interval at which the concave portions and the group of grooves 21A form a so-called line and space. In the meantime, concave portions 19C and 19D are provided so that an interval dc between the concave portion and a groove 16C closest to the group of grooves 21A in the group of grooves 21B and an interval dd between the concave portion and a groove 16D on the reverse side to the groove 16C in the group of grooves 21B are within 20 times of the width w of the groove 16. Each concave portion 19A, 19B, 19C, 19D is formed at least before the barrier metal layer not shown is formed as described above and dummy the interconnection 20 is formed inside each via the barrier metal layer not shown.

Figure 5B:
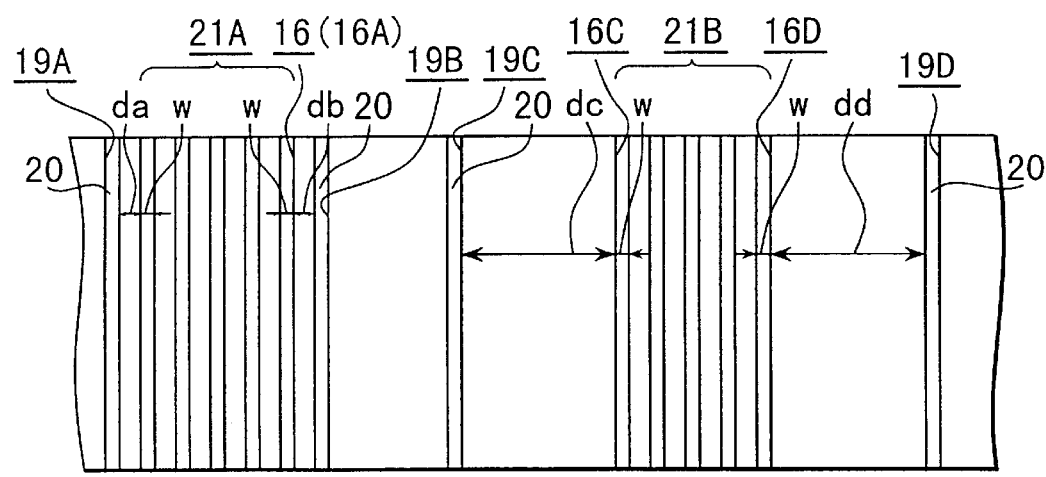
Figure 5C:
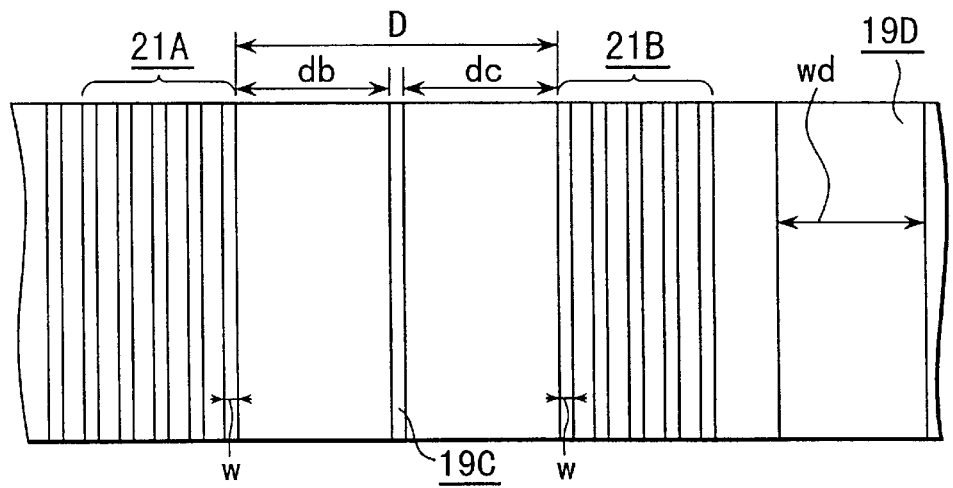

Or as shown in FIG. 5C, in case the interval D between the group of grooves 21A and the group of grooves 21B is within 40 times of the width w of the groove 16, the concave portion 19C may be also formed so that the interval db between the group of grooves 21A and the concave portion 19C and the interval dc between the concave portion 19C and the group of grooves 21B are within 40 times of the width w of the groove 16 in place of forming the concave portion 19B shown in FIG. 5B. Also, the concave portion 19D can be also formed so that it has wider width Wd than the width of the groove 16. It is natural, however, that the other concave portions 19A, 19B and 19C shown in FIG. 5B can be also formed so that each has wider width than the width w of the groove 16.

Next, referring to FIGS. 6A, 6B, and 6C, an example of a grooved interconnection formed so that it is turned plural times halfway will be described.

Figure 6A:
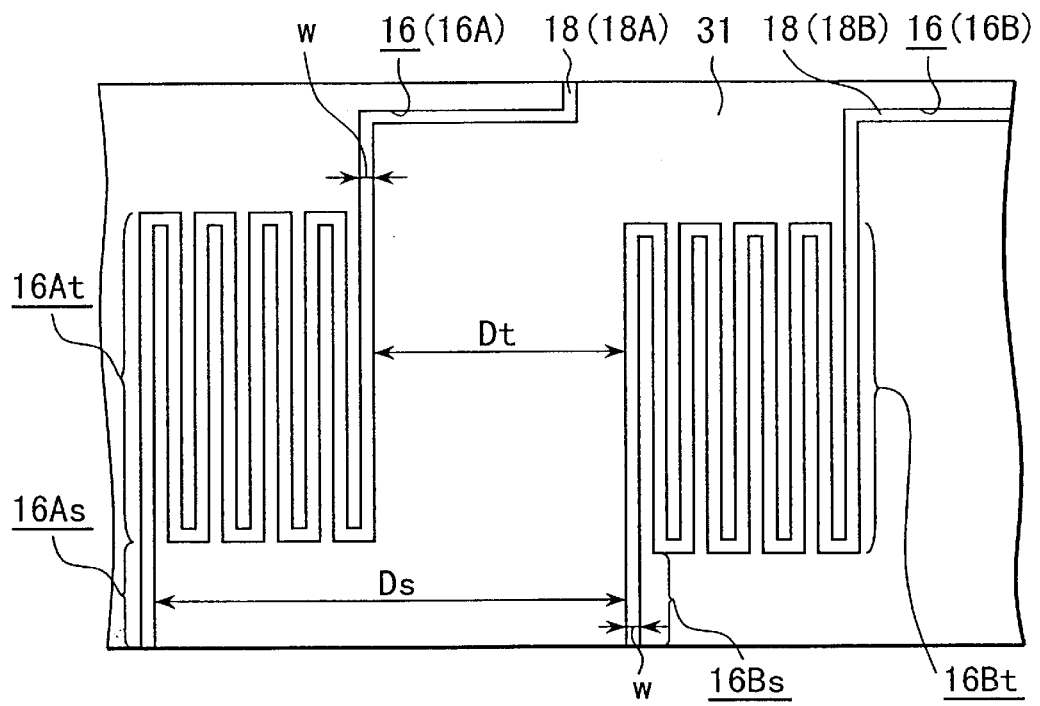
FIGS. 6A to 6C are explanatory drawings showing the arrangement of a concave portion for relaxing the compressive stress of the barrier metal layer.
Figure 6B:
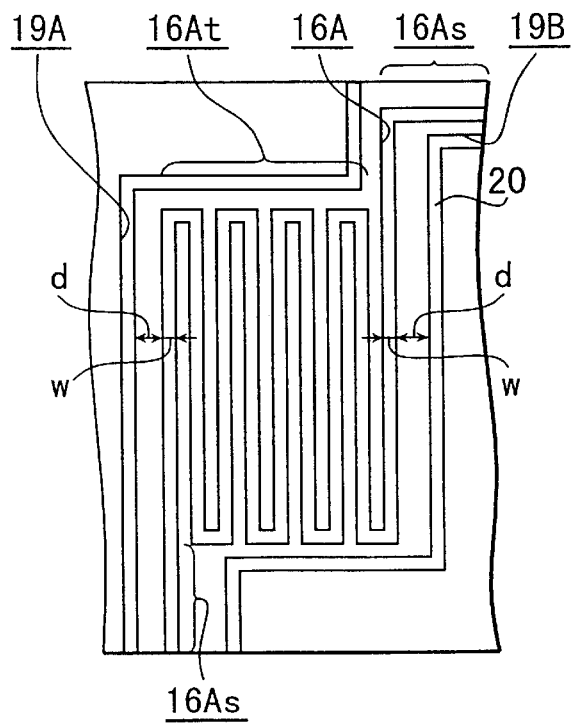

As shown in FIG. 6A, the groove 16 (16A) formed so that it is turned plural times halfway and the groove 16 (16B) formed so that it is turned plural times halfway are formed at a predetermined interval in the insulating film 31. For example, an interval Dt between a turned part 16At of the groove 16A and a turned part 16Bt of the groove 16B is longer than 20 times of the width w of the groove 16, and an interval Ds between a single part 16As of the groove 16A and a single part 16Bs of the groove 16B is also longer than 20 times of the width w of the groove 16. Grooved interconnection 18 (18A) is formed inside the groove 16A via the barrier metal layer not shown and grooved interconnection 18 (18B) is formed inside the groove 16B via the barrier metal layer not shown.

As for the grooved interconnection having the configuration described above, as shown in FIG. 6B, concave portions 19A and 19B are formed on both sides of the single part 16As of the groove 16A so that the concave portions surround the part 16At formed by turning the groove 16A plural times and so that an interval d between the concave portion and the groove 16A is within 20 times of the width w of the groove 16. As for the groove 16B shown in FIG. 6A, concave portions are also arranged similarly to the groove 16A though they are not shown. Each concave portion 19A, 19B is formed at least before the barrier metal layer not shown is formed as described above and dummy interconnection 20 is formed inside each via the barrier metal layer not shown.

Figure 6C:
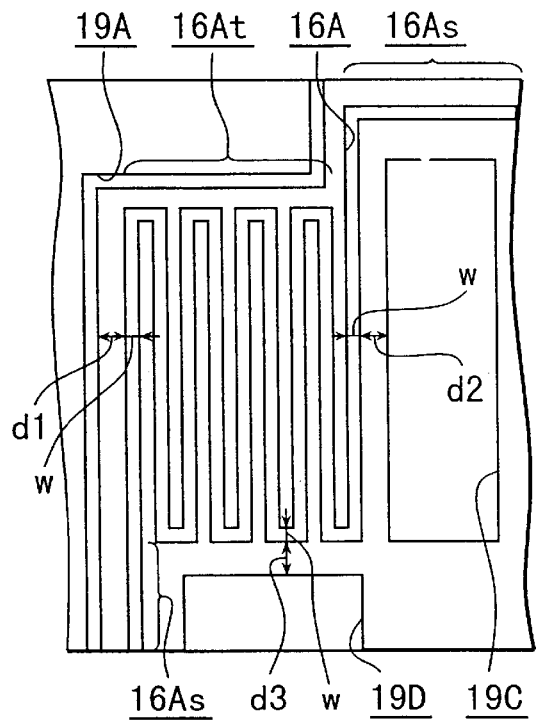

As shown in FIG. 6C, the concave portion 19A as a dummy groove is arranged in a continuous state on one side of the single part 16As of the groove 16A so that it surrounds one side of the part 16At formed by turning the groove 16A plural times and so that an interval d1 between the concave portion and the groove 16A is within 20 times of the width w of the groove 16. In addition, concave portions 19C and 19D like a rectangle when viewed from the top are formed on the other side of the single part 16As of the groove 16A so that the concave portions surround the other side of the part 16At by turning the groove 16A plural times and each interval d2, d3 between each concave portion and the groove 16A is within 20 times of the width w of the groove 16. As for the groove 16B shown in FIG. 6A though it is not shown, a concave portion is also arranged similarly to the groove 16A. Each concave portion 19A, 19C, 19D is formed at least before the barrier metal layer not shown is formed as described, above.

Next, referring to a manufacturing process drawing shown in FIGS. 7, a first embodiment of a first manufacturing method according to the invention will be described.

As shown in FIG. 7A, after predetermined devices not shown are formed on a substrate such as a semiconductor substrate 11, a first insulating film (interlayer insulating film) 12 for covering the devices is formed on the substrate 11. Further, a contact hole 13 is formed in a predetermined position of the first insulating film 12 and a plug 14 is formed by embedding tungsten for example in the contact hole 13.

Next, after polyallylether for example as organic material low in a dielectric constant is applied up to the thickness of 500 nm on the first insulating film 12 by spin coating for example, it is cured at 400 for example and an organic insulating film low in a dielectric constant 31 is formed.

Next, silicon oxide for example is deposited up to the thickness of 150 nm on the organic insulating film low in a dielectric constant 31 by plasma CVD and a hard mask 32 used when polyallylether is etched is formed. As described above, a second insulating film 15 composed of the organic insulating film low in a dielectric constant 31 and the hard mask 32 is formed.

Next, after a resist film 33 is formed by applying resist on the second insulating film 15, predetermined plural groove-like openings 34 for forming a groove through the resist film 33 by lithography are formed. In case an interval between the groovelike openings 34 is wider than 20 times of the width of the groovelike opening 34, a groovelike opening 35 that is not related to grooved interconnection is formed between one groovelike opening 34A and the other groove-like opening not shown respectively opposite, an interval d' between the one groovelike opening 34A and the groovelike opening 35 that is not related to grooved interconnection is set to within 20 times of the width w' of the groovelike opening 34 and an interval between the other groovelike opening not shown and the groovelike opening 35 that is not related to grooved interconnections is set to within 20 times of the width of the groovelike opening 34. In case an interval between groovelike openings 34 exceeds 40 times of the width of the groovelike opening 34, two groovelike openings 35 that are not related to grooved interconnections are formed to meet the condition described above.

Next, as shown in FIG. 7B, the hard mask 32 is etched using the patterned resist film 33 for an etching mask and for example, groovelike openings 36 and 37 0.3 fÊm wide are formed. The opening 36 functions as a groove for embedding an interconnection and the opening 37 becomes a concave portion to be a dummy groove.

Next, as shown in FIG. 7C, the organic insulating film low in a dielectric constant 31 is etched using the patterned hard mask 32 for an etching mask, a groove 16 0.3 fÊm wide for example is formed and simultaneously a concave portion 19 to be a dummy groove is formed. As described above, the concave portion 19 is continuously formed along the groove 16 apart by distance d equivalent to within 20 times of the width w of the groove 16 from the groove 16 (16A) at the end.

In the etching, for example, an electron cyclotron resonance (ECR) plasma etching device is used and an etching condition is set as follows. For an example, nitrogen (flow rate: 40 sccm) and helium (flow rate: 165 sccm) are used for the etching gas, the pressure of etching ambient atmosphere is set to 0.8 Pa, microwave power is set to 500 W (2.45 GHz), RF power is set to 100 W and the temperature of the substrate is set to −50. As a characteristic when the resist film and polyallylether are etched extremely resembles, the resist film 33 is etched and removed in a short time and afterward, the hard mask 32 functions as an etching mask.

Next, as shown in FIG. 7D, a barrier metal layer 17 is formed by depositing tantalum nitride for example up to the thickness of 50 nm on the inner wall of each groove 16 and the second insulating film 15 by DC magnetron sputtering for example. Further, copper is deposited up to the thickness of 150 nm for example and a seed layer not shown for electroplating is formed. As described above, single damascene structure is formed.

For an example of a condition for depositing tantalum nitride, a tantalum target is used for a target, argon (flow rate: 60 sccm) and nitrogen (flow rate: 40 sccm) are used as process gases, the pressure of ambient atmosphere for forming a film is set to 0.4 Pa, DC power is set to 6 kW and temperature for forming a film is set to 200. For an example of a condition for depositing copper, a copper target is used for a target, argon (flow rate: 100 sccm) is used for a process gas, the pressure of ambient atmosphere for forming a film is set to 0.4 Pa, DC power is set to 12 kW and temperature for forming a film is set to 100.

Next, as shown in FIG. 7E, copper is embedded inside each groove 16 and the concave portion 19 by copper electroplating. At that time, copper is also deposited on the second insulating film 15 via the barrier metal layer. Afterward, extra copper and the barrier metal layer on the second insulating film 15 are removed by chemical mechanical polishing (CMP) for example and a grooved interconnection 18 made of copper is formed inside the groove 16 via the barrier metal layer 17. At that time, copper is also embedded inside the concave portion 19 via the barrier metal layer 17 and dummy interconnection 20 is formed.

However, the concave portion 19 formed outside a group of grooved interconnections 22 composed of plural grooved interconnections 18 is deformed by the compressive stress of the barrier metal layer 17 shown in FIG. 7D as described in relation to the problem in the related art to be solved by the invention, therefore copper is not fully embedded and a void not shown may be made, however, as the dummy interconnection 20 formed in the concave portion 19 does not function as the interconnection of the device, the above does not particularly matter in the reliability of the device.

In the embodiment of the first manufacturing method, as the concave portion 19 is continuously formed along the groove 16 at an interval d within 20 times of the width w of the groove 16 around the groove 16 when the groove 16 is formed through the second insulating film 15, compressive stress of the barrier metal layer 17 formed in a large area 15A of the second insulating film 15 concentrates at the concave portion 19 when afterward, the barrier metal layer 17 is formed. Therefore, as compressive stress applied to the groove 16A is relaxed and only the compressive stress of the barrier metal layer 17 between the groove 16A and the concave portion 19 is left without being relaxed, the deformation of the groove 16A is inhibited.

That is, compressive stress of the barrier metal layer 17 formed between the groove 16 and the concave portion 19 is not enough to deform the groove 16, particularly the groove 16A at the end of the plural grooves 16. In other words, the barrier metal layer 17 between the groove 16 and the concave portion 19 does not have sufficient compressive stress to deform the groove 16A. Therefore, even if the compressive stress of the barrier metal layer 17 concentrates at the groove 16A, the groove 16A is not deformed. As a result, copper which is a conductive material is satisfactorily embedded without making a void inside the groove 16A. As a result, the shape of the groove 16 is kept.

In the above description, a method of forming a grooved interconnection by a so-called single damascene method is described, however, when a grooved interconnection is formed by a so-called dual damascene method, the above concave portion that relaxes the compressive stress of the barrier metal layer can be also formed. In this case, when a groove for forming grooved interconnections is formed by the dual damascene method, the concave portion has only to be also formed together.

The cross section of each concave portion is not limited to the rectangular cross section described above; it may be also a V shape and may be also a U shape.

Next, referring to manufacturing process drawings shown in FIGS. 8 to 10, a first embodiment of a manufacturing method for forming an approximately V-shaped concave portion as a second manufacturing method according to the invention will be described.

Figure 8A:
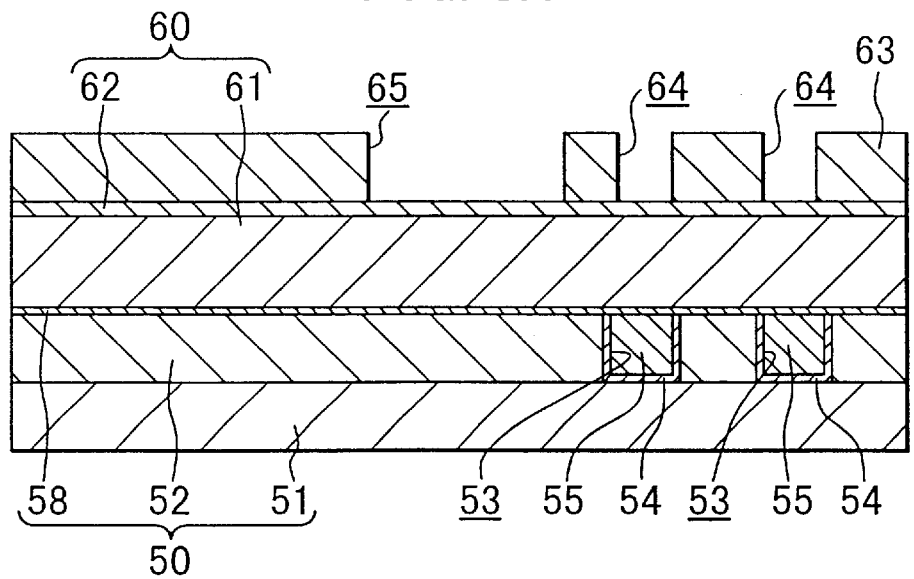
FIGS. 8A to 8C are a process drawing showing the first embodiment by a second manufacturing method according to the invention.

As shown in FIG. 8A, predetermined devices not shown are formed on a semiconductor substrate not shown and a first interlayer insulating film 51 for covering the devices is formed on the semiconductor substrate. A contact hole not shown is formed through the first interlayer insulating film 51 and a plug not shown is formed inside the contact hole. Further, a second interlayer insulating film 52 is formed on the first interlayer insulating film 51. A groove 53 is formed through the second interlayer insulating film 52 and grooved interconnection 55 formed by embedding copper via the barrier metal layer 54 is provided inside the grooves 53. A diffusion preventing layer 56 is formed on the second interlayer insulating film 52 with the grooved interconnection 55 covered. The diffusion preventing layer 58 is formed by depositing silicon nitride up to the thickness of 50 nm by plasma CVD for example. Such a substrate 50 is prepared.

Next, after polyallylether for example as the material of the first organic insulating film low in a dielectric constant is applied up to the thickness of 800 nm on the diffusion preventing layer 56 of the substrate 50 by spin coating for example, it is cured at 400 for example and a first insulating film 61 is formed. Next, an etching stopper layer 62 is formed by depositing silicon oxide for example up to the thickness of 100 nm on the first insulating film 61 by plasma CVD. As described above, the first insulating film 60 is formed by the first organic insulating film low in a dielectric constant 61 and the etching stopper layer 62.

Next, after resist is applied on the etching stopper layer 62 and a resist film 63 is formed, a predetermined opening 64 for forming a contact hole through the resist film 63 by lithography is formed and a groove pattern 65 is formed in a position apart by predetermined distance from a position viewed from the top in which grooved interconnection is formed.

Figure 8B:
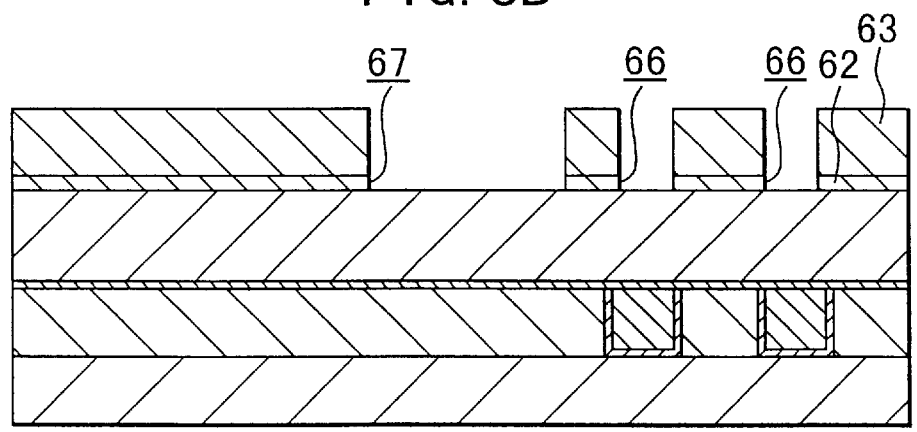

Next, as shown in FIG. 8B, the etching stopper layer 62 is etched using the patterned resist film 63 as an etching mask, and an opening 66 to be a contact hole 0.3 fÊm in diameter and an open groove 67 for forming a first concave portion to be a dummy groove are formed.

Figure 8C:
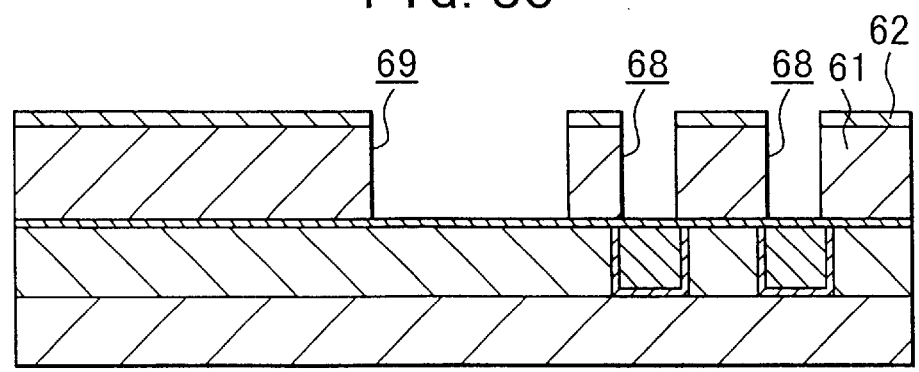

Next, as shown in FIG. 8C, the first organic insulating film low in a dielectric constant 61 is etched using the patterned etching stopper layer 62 for an etching mask, a contact hole 68 0.3 fÊm in diameter is formed and simultaneously a first concave portion 69 is formed so that it has the width of 1.2 fÊm for example. It is desirable that the first concave portion 69 is formed so that it has width approximately wider than 1.0 fÊm and narrower than 3.0 fÊm.

In the above etching, an electron cylotron resonance (ECR) plasma etching device is used for example and an etching condition is set as follows. For an example, nitrogen (flow rate: 40 sccm) and helium (flow rate: 165 sccm) are used as etching gases, the pressure of an etching atmosphere is set to 0.8 Pa, microwave power is set to 500 W (2.45 GHz), RF power is set to 100 W and the temperature of the substrate is set to −50. As a characteristic when the resist film and polyallylether are etched extremely, the resist film 63 is etched and removed in a short time and afterward, the hard mask 62 functions as an etching mask.

Figure 9A:
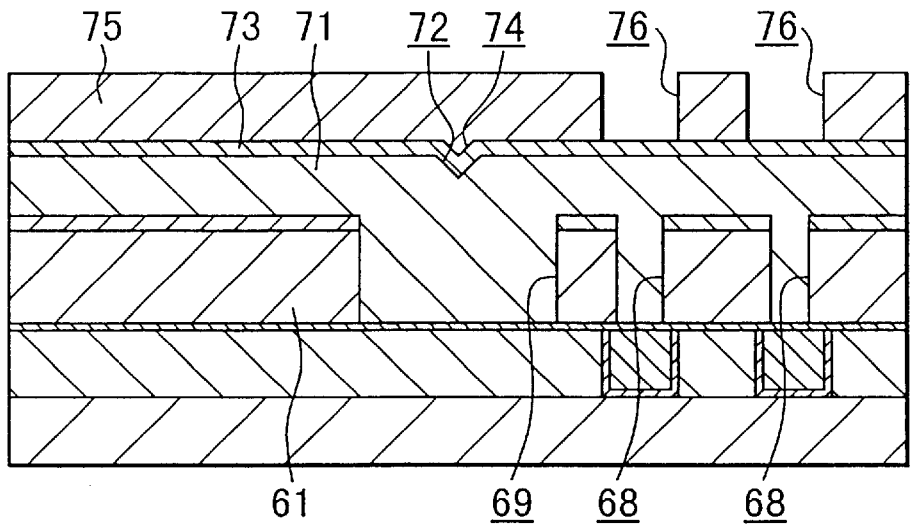
FIGS. 9A to 9C are the process drawing (a continuation 1) showing the first embodiment by the first manufacturing method according to the invention.

Next, as shown in FIG. 9A, after polyallylether is deposited up to the thickness of 500 nm by spin coating as the first organic insulating film low in a dielectric constant 61 is formed, it is cured at 400, a second organic insulating film low in a dielectric constant 71 is formed, and the contact hole 68 and the first concave portion 69 are embedded again. At this time, the second organic insulating film low in a dielectric constant 71 on the contact hole 68 is substantially planarized; however, a depression 72 is formed along the first concave portion 69 in the second organic insulating film low in a dielectric constant 71 on the first concave portion 69. The depression 72 is often made because of the characteristic of application when the first concave portion 69 is approximately wider than 1.0 fÊm and narrower than 3.0 fÊm.

Next, a hard mask 73 when polyallylether is etched is formed by depositing silicon oxide up to the thickness of 100 nm on the second organic insulating film low in a dielectric constant 71 by plasma CVD. As described above, a second insulating film 70 is composed by the second organic insulating film low in a dielectric constant 71 and the hard mask 73. At that time, a second concave portion 74 is formed in the hard mask 73 because of the depression 72.

Next, after a resist film 75 is formed by applying resist on the hard mask 72, a groovelike opening 76 for forming a groove through the resist film 75 by lithography is formed.

Figure 9B:
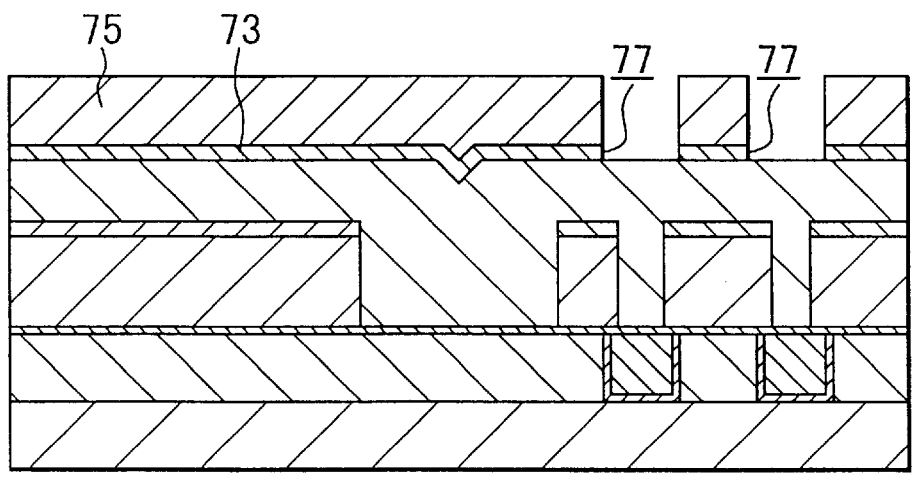

Next, as shown in FIG. 9B, the hard mask 73 is etched using the patterned resist film 75 for an etching mask and a groovelike opening 77 that is 0.3 fÊm wide is formed.

Figure 9C:
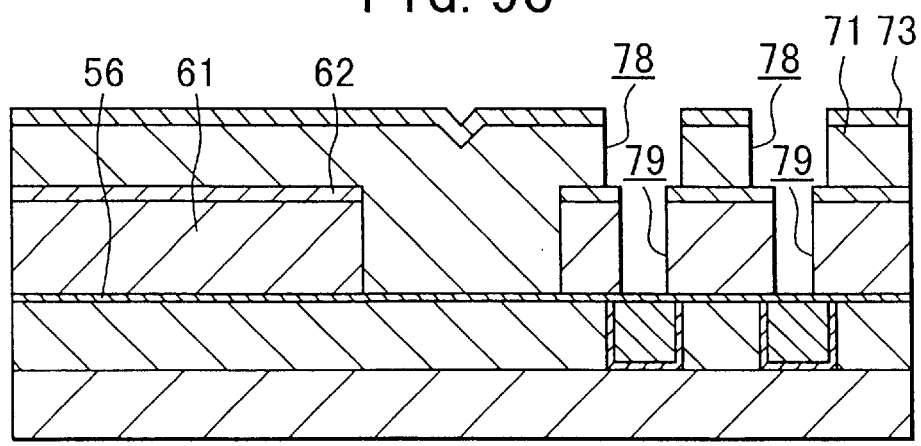

Next, as shown in FIG. 9C, the second and first organic insulating films low in a dielectric constant 71 and 61 are etched using the patterned hard mask 73 for an etching mask, a groove 78 0.3 fÊm wide for example is formed through the second organic insulating film low in a dielectric constant 71 and a contact hole 79 is formed again through the first organic insulating film low in a dielectric constant 61 using the etching stopper layer 62 for an etching mask. Finally, the diffusion preventing layer 56 at the bottom of the contact hole 79 is etched and removed.

The etching of the second organic insulating film low in a dielectric constant 71 is executed under the similar condition to the etching of the first organic insulating film low in a dielectric constant 61 for example. Also in the etching, as a characteristic when the resist film and polyallylether are etched extremely, the resist film 75 is etched and removed in a short time and afterward, the hard mask 73 functions as an etching mask.

Figure 10A:
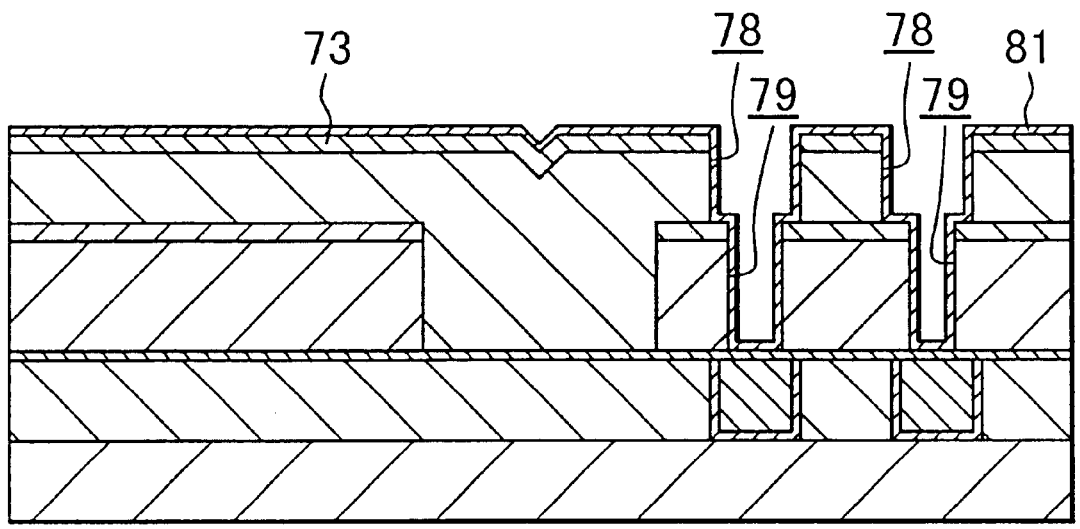
FIGS. 10A and 10B are the process drawing (a continuation 2) showing the first embodiment by the first manufacturing method according to the invention.

Next, as shown in FIG. 10A, tantalum nitride for example is deposited up to the thickness of 50 nm on the inner wall of each groove 78 and each contact hole 79 and the hard mask 73 by DC magnetron sputtering for example and a barrier metal layer 81 is formed. Further, a copper seed layer not shown is formed by depositing copper up to the thickness of 100 nm for example.

For an example of a condition for depositing tantalum nitride, a tantalum target is used for a target, argon (flow rate: 60 sccm) and nitrogen (flow rate: 40 sccm) are used as process gases, the pressure of ambient atmosphere for forming a film is set to 0.4 Pa, DC power is set to 6 kW and temperature in forming a film is set to 200. For an example of a condition for depositing copper, a copper target is used for a target, argon (flow rate: 100 sccm) is used as a process gas, the pressure of ambient atmosphere for forming a film is set to 0.4 Pa, DC power is set to 12 kW and temperature in forming a film is set to 100.

Figure 10B:
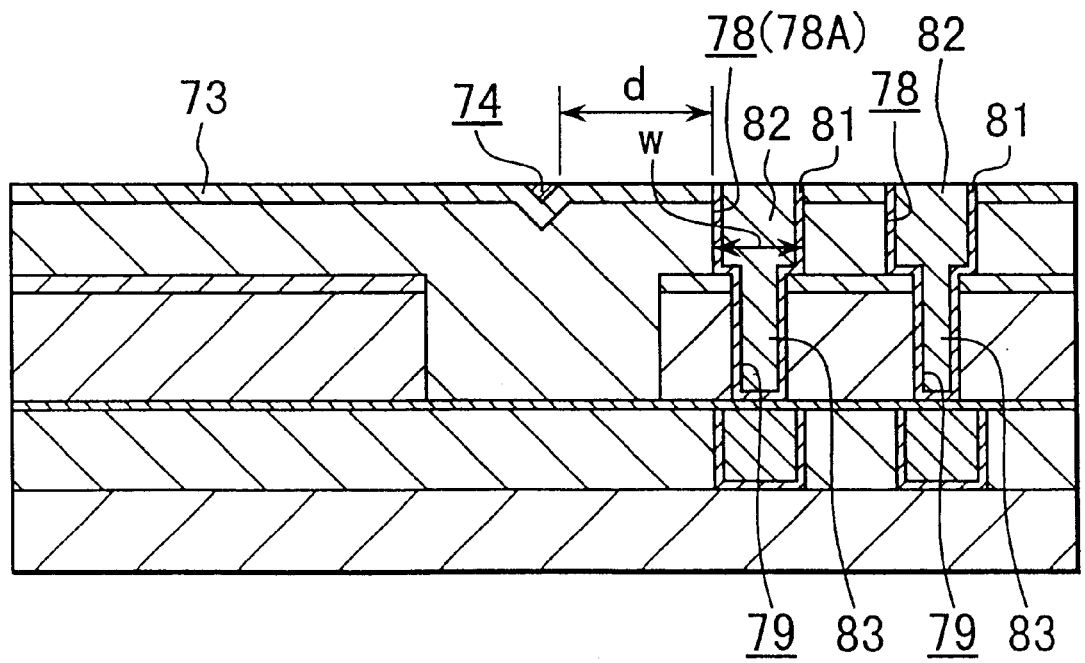

Next, as shown in FIG. 10B, copper is embedded inside each groove 78 and each contact hole 79 by copper electroplating. At that time, copper is also deposited on the second organic insulating film low in a dielectric constant 71 via the hard mask 73 and the barrier metal layer 81. Afterward, extra copper and the barrier metal layer on the hard mask 73 are removed by CMP for example, grooved interconnection 82 made of copper is formed inside each groove 78 via the barrier metal layer 81 and a plug 83 made of copper is formed inside each contact hole 79 via the barrier metal layer 81. At that time, tantalum nitride (or tantalum nitride and copper) is also embedded in the second concave portion 74. As described above, tantalum nitride and copper are left in the second concave portion 74, however, it does not particularly matter in the reliability of the device.

In the second manufacturing method, as when the contact hole 79 is formed through the first insulating film 60, the first concave portion 69 is formed in a position apart by predetermined distance from the contact hole 79 around a part located under the groove 78 formed afterward. When the second organic insulating film low in a dielectric constant 71 of the second insulating film 70 is formed, the depression 72 is formed on the surface of the second organic insulating film low in a dielectric constant 71 on the first concave portion 69. Further, the hard mask 73 is formed and the second concave portion 74 is formed in a state in which the depression 72 is transferred on the surface of the hard mask. Compressive stress which the barrier metal layer 81 formed afterward is relaxed by the second concave portion 74 and it is inhibited that the groove 78, particularly the groove 78 (78A) at the end is deformed by the compressive stress of the barrier metal layer 81. As a result, conductive material is satisfactorily embedded without making a void inside each groove 78.

As the second concave portion 74 is continuous or intermittently formed along the groove 78A by setting an interval d between the groove 78 and the second concave portion 74 within an interval at which the shape of the groove 78A at the end is kept when the barrier metal layer 81 is formed on the second insulating film 70, the groove 78A is not deformed by the barrier metal layer 81 formed between the groove 78A and the second concave portion 74. In other words, the barrier metal layer 81 between the groove 78A and the second concave portion 74 does not have compressive stress enough to deform the groove 78A. Therefore, even if the compressive stress of the barrier metal layer 81 concentrates at the groove 78A, the groove 78A is not deformed.

For example, in case the interval d between the second concave portion 74 and the groove 78A is within 20 times of the width w of the groove 78, the compressive stress of the barrier metal layer 81 between them is not enough to deform the groove 78A. The reason is that as compressive stress which the barrier metal layer (a part of the barrier metal layer formed on the left side of the concave portion 74 as shown in FIG. 10A) formed in a large area has concentrates at the second concave portion 74, the compressive stress of the barrier metal layer 81 between the groove 78A and the second concave portion 74 is relaxed and thereby, the deformation of the groove 78A is inhibited. As the barrier metal layer 81 formed on the second insulating film 70 between the grooves 78 is short, that is, is not long enough to exceed 20 times of the width w of the groove (to have compressive stress enough to deform the groove, each groove 78 is not deformed by the barrier metal layer 81 between the grooves. As a result, conductive material is satisfactorily embedded without making a void in each groove 78.

In case an interval between the second concave portion 74 and the groove 78A at the end exceeds 20 times of the width w of the groove, the groove 78A at the end is deformed by compressive stress which the barrier metal layer 81 formed on the second insulating film 70 between them has. Therefore, the interval d between the second concave portion 74 and the groove 78A at the end is required to be within 20 times of the width w of the groove.

Next, for a second embodiment of the second manufacturing method according to the invention, referring to manufacturing process drawings shown in FIGS. 11 and 12, a manufacturing method of forming an approximately V-shaped concave portion will be described. In FIGS. 11 and 12, the same reference number is allocated to the similar component to that described referring to FIGS. 8 to 10.

Figure 11A:
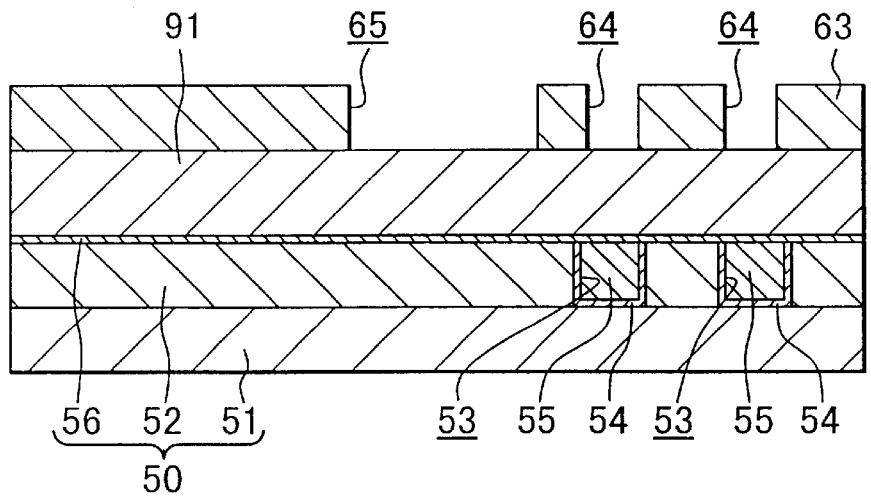
FIGS. 11A to 11C are a process drawing showing the second embodiment by the second manufacturing method according to the invention.

As shown in FIG. 11A, predetermined devices not shown are formed on a semiconductor substrate not shown and a first interlayer insulating film 51 for covering the devices is formed on the semiconductor substrate. A contact hole not shown is formed through the first interlayer insulating film 51 and a plug not shown is formed inside the contact hole. Further, a second interlayer insulating film 52 is formed on the first interlayer insulating film 51. A groove 53 is formed through the second interlayer insulating film 52 and grooved interconnection 55 formed by embedding copper via a barrier metal layer 54 is provided inside the groove 53. A diffusion preventing layer 56 is formed on the second interlayer insulating film 52 with the grooved interconnection 55 covered. The diffusion preventing layer 56 is formed by depositing silicon nitride up to the thickness of 50 nm by plasma CVD for example. Such a substrate 50 is prepared.

Next, a first insulating film 91 by depositing silicon oxide for example up to the thickness of 800 nm by CVD is formed on the diffusion preventing layer 56.

Next, after a resist film 63 is formed on the first insulating film 91 by applying resist, a predetermined opening 64 for forming a contact hole through the resist film 63 by lithography is formed and a groove pattern 65 is formed in a position apart by determined distance from a position viewed from the top in which grooved interconnection is formed.

Figure 11B:
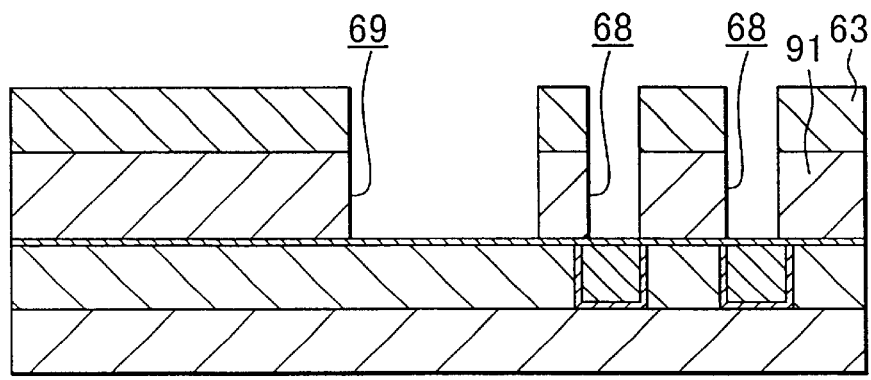

Next, as shown in FIG. 11B, the first insulating film 91 is etched using the patterned resist film 63 for an etching mask, a contact hole 68 0.3 fÊm in diameter for example is formed and simultaneously, a first concave portion 69 as a dummy groove is formed so that it has the width of 1.2 fÊm for example. In the etching, normal reactive ion etching is used. It is desirable that the first concave portion 69 is approximately wider than 1.0 fÊm and narrower than 3.0 fÊm. Afterward, the resist film 63 is removed.

Figure 11C:
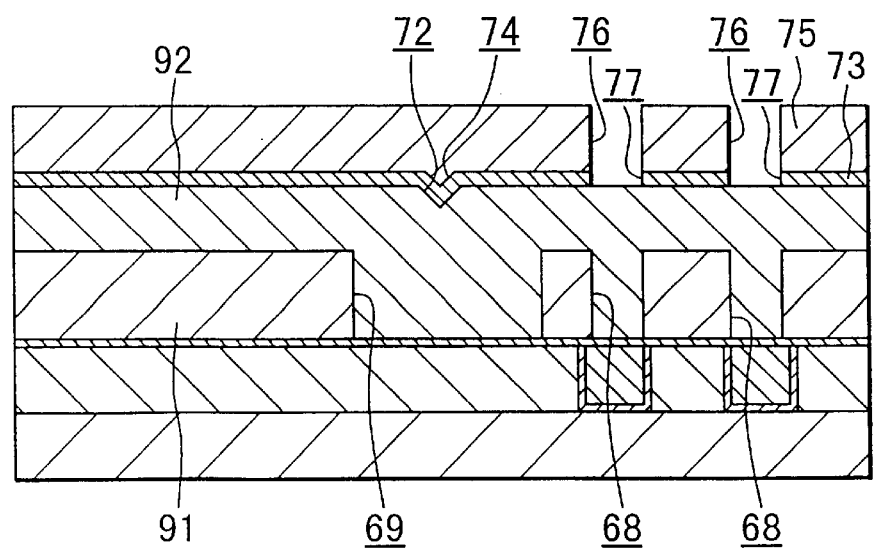

Next, as shown in FIG. 11C, after polyallylether is deposited up to the thickness of 500 nm on the first insulating film 91 by spin coating, it is cured at 400, an organic insulating film low in a dielectric constant 92 is formed, and the contact hole 68 and the first concave portion 69 are embedded again. At this time, the organic insulating film low in a dielectric constant 92 on the contact hole 68 is substantially planarized, however, a depression 72 is formed along the first concave portion 69 on the organic insulating film low in a dielectric constant 92 on the second concave portion 69. The depression 72 is often made when the width of the first concave portion 69 is approximately wider than 1.0 fÊm and narrower than 3.0 fÊm because of the characteristic of application.

Next, a hard mask 73 used when polyallylether is etched is formed on the organic insulating film low in a dielectric constant 92 by depositing silicon oxide for example up to the thickness of 100 nm by plasma CVD. As described above, a second insulating, film 90 is composed by the organic insulating film low in a dielectric constant 92 and the hard mask 73. At that time, a second concave portion 74 is formed on the hard mask 73 by the depression 72.

Next, after resist is applied on the hard mask 73 and a resist film 75 is formed, a groovelike opening 76 for forming a groove through the resist film 75 by lithography is formed.

Next, the hard mask 73 is etched using the patterned resist film 75 for an etching mask and a groovelike opening 77 0.3 fÊm wide for example is formed.

Figure 12A:
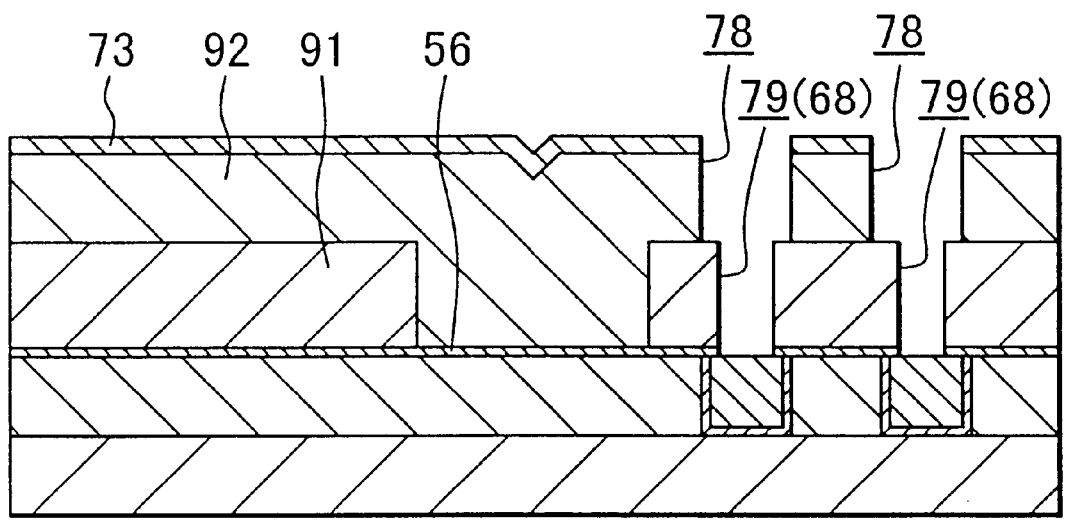
FIGS. 12A and 12B are the process drawing (a continuation) showing the second embodiment by the second manufacturing method according, to the invention.

Next, as shown in FIG. 12A, the organic insulating film low in a dielectric constant 92 is etched using the patterned hard mask 73 for an etching mask, a groove 78 0.3 fÊm wide for example is formed and a contact hole 79 (68) is formed through the first insulating film 91 again using the first insulating film 91 for an etching stopper. Finally, the diffusion preventing layer 56 at the bottom of the contact hole 79 is etched.

In the etching of the organic insulating film low in a dielectric constant 92, for example, an ECR plasma etching device is used and an etching condition is set as follows. For an example, nitrogen (flow rate: 40 sccm) and helium (flow rate: 165 sccm) are used for etching gas, the pressure of etching ambient atmosphere is set to 0.8 Pa, microwave power is set to 500 W (2.4 GHz), RF power is set to 100 W and the temperature of the substrate is set to −50. As a characteristic when the resist film and polyallylether are etched extremely, the resist film 75 is etched and removed in a short time and afterward, the hard mask 73 functions as an etching mask.

Figure 12B:
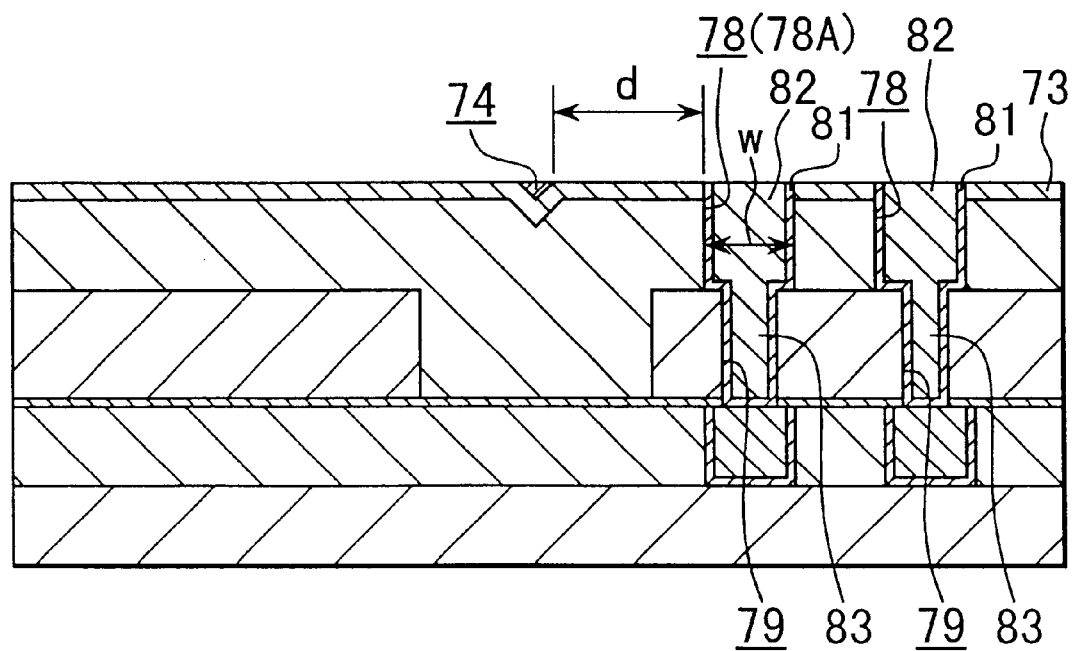
Figure 13:
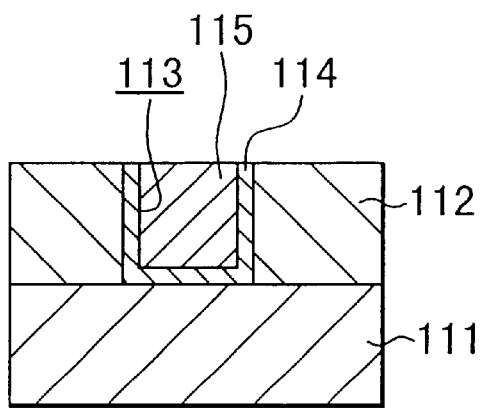
FIG. 13 is an explanatory drawing for explaining prior art.
Figure 14A:
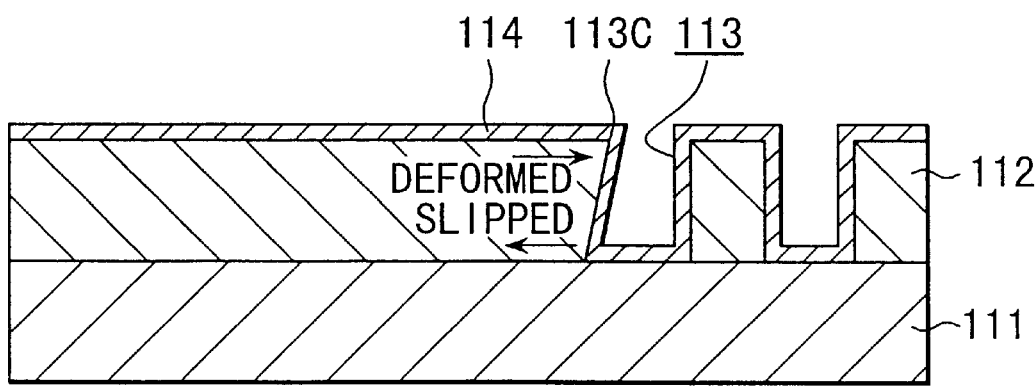
FIGS. 14A and 14B are explanatory drawings for explaining a problem.
Figure 14B:
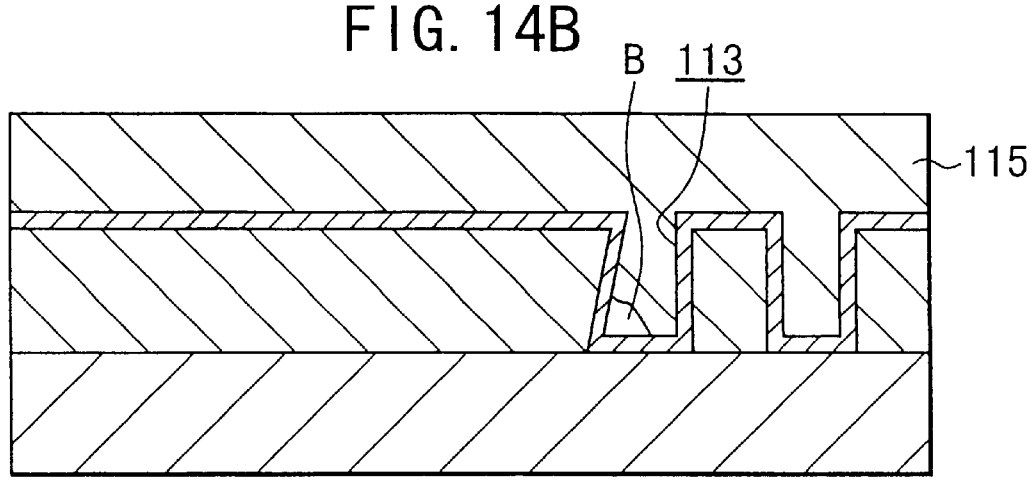

Next, as shown in FIG. 12B, a barrier metal layer 81 is formed by depositing tantalum nitride for example up to the thickness of 50 nm on the inner wall of each groove 78 and each contact hole 79 and the hard mask 73 by DC magnetron sputtering for example. Further, copper is deposited up to the thickness of 100 nm for example and a copper seed layer not shown is formed.

For an example of a condition for depositing tantalum nitride, a tantalum target is used for a target, argon (flow rate: 60 sccm) and nitrogen (flow rate: 40 sccm) are used for process gases, the pressure of ambient atmosphere for forming a film is set to 0.4 Pa, DC power is set to 6 kW and temperature for forming a film is set to 200. For an example of a condition for depositing copper, a copper target is used for a target, argon (flow rate: 100 sccm) is used for process gas, the pressure of ambient atmosphere for forming a film is set to 0.4 Pa, DC power is set to 12 kW and temperature for forming a film is set to 100.

Next, copper is embedded inside each groove 78 and each contact hole 79 by copper electroplating. At that time, copper is also deposited on the organic insulating film low in a dielectric constant 92 via the hard mask 73 and the barrier metal layer 81. Afterward, extra copper and the barrier metal layer on the hard mask 73 are removed by chemical mechanical polishing (CMP) for example, grooved interconnection 82 made of copper is formed inside each groove 78 via the barrier metal layer 81 and a plug 83 made of copper is formed inside each contact hole 79 via the barrier metal layer 81. At that time, tantalum nitride (or tantalum nitride and copper) is also embedded in the second concave portion 74. As described above, tantalum nitride and copper are left in the second concave portion 74, however, it does not particularly matter in the reliability of the device.

According to the second manufacturing method, as the first concave portion 69 is formed in a position apart from the contact hole 79 by predetermined distance around a part located under the groove 78 formed later when the contact hole 79 is formed through the first insulating film 91, the depression 72 is formed on the surface of the organic insulating film low in a dielectric constant 92 on the first concave portion 69 when the organic insulating film low in a dielectric constant 92 of the second insulating film 90 is formed, further, the hard mask 73 is formed and the second concave portion 74 is formed in a state in which the depression 72 is transferred on the surface, compressive stress which the barrier metal layer 81 has is relaxed by a the second concave portion 74 when afterward, the barrier metal layer 81 is formed and it is inhibited that the groove 78,particularly the groove 78 (78A) at the end is deformed by the compressive stress of the barrier metal layer 81. As a result, conductive material is satisfactorily embedded without making a void inside each groove 78.

As the second concave portion 74 is continuously or intermittently formed along the groove 78A within the interval d which between the groove 78 and the second concave portion 74 keeps the shape of the groove 78A at the end when the barrier metal layer 81 is formed on the second insulating film 90, the groove 78A is not deformed by the barrier metal layer 81 formed between the groove 78A and the second concave portion 74. In other words, the barrier metal layer 81 between the groove 78A and the second concave portion 74 does not have compressive stress enough to deform the groove 78A. Therefore, even if the compressive stress of the barrier metal layer 81 concentrates at the groove 78A, the groove 78A is not deformed.

For example, in case the interval d between the second concave portion 74 and the groove 78A is within 20 times of the width w of the groove 78, normally the compressive stress of the barrier metal layer 81 between them is not enough to deform the groove 78A. The reason is that as compressive stress which the barrier metal layer (a part of the barrier metal layer formed on the left side of the concave portion 74 as shown in FIG. 12B) formed in a large area has concentrates at the second concave portion 74, the compressive stress of the barrier metal layer 81 between the groove 78A and the second concave portion 74 is relaxed and as a result, the deformation of the groove 78A is inhibited. As the barrier metal layer 81 formed on the second insulating, film 90 between each groove 78 is short, that is, is not long enough to exceed 20 times of the width w of the groove which is length having compressive stress enough to deform the groove, each groove 78 is not deformed by the barrier metal layer 81 between the grooves. As a result, copper as conductive material is satisfactorily embedded without making a void in each groove 78.

In case an interval between the second concave portion 74 and the groove 78A at the end exceeds 20 times of the width w of the groove, the groove 78A at the end is deformed by compressive stress which the barrier metal layer 81 formed on the second insulating film 90 between the second concave portion and the groove at the end has. Therefore, the interval d between the second concave portion 74 and the groove 78A at the end is required to be within 20 times of the width w of the groove.

In place of silicon oxide used in the embodiments, insulating material having SiOx(CH3)y as a main component can be also used. In this case, H2O2 (flow rate: 100 sccm) and monomethyl silane (flow rate: 10 sccm) are used for process gas using CVD, the temperature of the substrate is set to 0, the pressure of ambient atmosphere for forming a film is set to 13 kPa and the substrate 100 nm thick is formed. Similarly, nanoporous silica can be also used. For a method of depositing nanoporous silica, after application is performed using a spin coater, aging is performed at 100, next, drying processing is performed at 100 and afterward, annealing is performed at 300. Similarly, insulating material having a copolymer of silanol (SiO(CH3)) and CxFy as a main component can be used. For a method of deposition, after application is performed using a spin coater, drying processing is executed at 100 and afterward, annealing is performed at 300.

In the above embodiments, polyallylether is used for organic material low in a dielectric constant, however, in addition, any can be selected and used out of cyclic fluorocarbon resin, a cyclohexane copolymer, polyallylether fluoride resin, polyimide fluoride resin, polypentafluorostyrene, polytetrafluoroethylene resin, polynaphthalin fluoride and polyimide resin for example. Insulating material is not limited to organic insulating material and inorganic insulating material weaker in mechanical strength than silicon oxide, for example xerogel or nanoporous silica can be also used.

In the above embodiments, copper is used for interconnection material, however, in addition, a copper alloy such as a copper-zirconium alloy, aluminum, an aluminum alloy such as an aluminum-silicon alloy, an aluminum-silicon-copper alloy and an aluminum-copper alloy, gold or nickel can be also used.

In the above embodiments, tantalum nitride is used for the barrier metal layer, however, in addition, the barrier metal layer can be also formed by a single level film of titanium, tantalum, titanium nitride, tungsten, tungsten nitride or tungsten nitride silicide or a laminated film selected out of the group of material described above including tantalum nitride. Also, the barrier metal layer can be also formed by CVD in addition to sputtering.

As described above, according to the semiconductor device according to the invention, as the concave portion is formed in the insulating film within a predetermined interval from the groove in which grooved interconnection is formed, the compressive stress of the barrier metal layer formed on the surface of the insulating film when the barrier metal layer is formed in the groove is relaxed by the concave portion. Therefore, as compressive stress which the barrier metal layer has is not large enough to deform the insulating film and the groove between the concave portion and the groove, the deformation of the groove is not caused. Therefore, the problem of the formation of a void in the grooved interconnection part can be avoided and the semiconductor device reliable on interconnection can be manufactured.

According to the first manufacturing method according to the invention, as the concave portion is formed in the insulating film within a predetermined interval from the groove when the groove is formed in the insulating film, compressive stress which the barrier metal layer has can be relaxed by the concave portion when afterward, the barrier metal layer is formed. Therefore, as the deformation of the insulating film can be inhibited by the compressive stress of the barrier metal layer, the deformation of the groove can be also inhibited. Therefore, as conductive material can be satisfactorily embedded without making a void in the groove, the problem of the formation of a void in the grooved interconnection part can be avoided and the semiconductor device reliable on interconnection can be manufactured.

According to the second manufacturing method according to the invention, as the first concave portion is formed in a position apart by predetermined distance from the contact hole around the part in the first insulating film located under the groove formed in the second insulating film when the contact hole is formed in the first insulating film and the second concave portion is formed on the surface of the second insulating film on the first concave portion when the second insulating film is formed, compressive stress which the barrier metal layer has can be relaxed by the second concave portion when afterward, the barrier metal layer is formed. Therefore, as the deformation of the second insulating film can be inhibited by the compressive stress of the barrier metal layer, the deformation of the groove can be also inhibited. Therefore, as conductive material can be satisfactorily embedded without making a void in the groove, the problem of the formation of a void in the grooved interconnection part can be avoided and the semiconductor device reliable on interconnection can be manufactured.

What is claimed is:

1. A semiconductor device having a groove formed through an insulating film made of organic material on a substrate, a barrier metal layer formed at least on the inner wall of said groove, and a grooved interconnection embedded inside said groove via said barrier metal layer, wherein:

a concave portion is formed around said grooved interconnection through said insulating film to preserve a shape of said groove.

2. A semiconductor device according to claim 1, wherein:

said concave portion is continuously or intermittently formed along said groove within a predetermined interval from said groove.

3. A semiconductor device according to claim 1, wherein:

said groove is provided at the end of a group of grooves composed of plural grooves respectively arranged at a predetermined interval; and said concave portion is continuously or intermittently formed along said groove within a predetermined interval from the groove provided at the end of said group of grooves outside said group of grooves.

4. A method of manufacturing a semiconductor device having a process for forming a groove through an insulating film made of organic material on a substrate, a process for forming a barrier metal layer at least on the inner wall of said groove, a process for embedding conductive material inside said groove via said barrier metal layer and a process for removing surplus conductive material and a surplus barrier metal layer on said insulating film, wherein:

when a groove is formed through said insulating film, a concave portion is formed around said groove to preserve a shape of said groove.

5. A method of manufacturing a semiconductor device according to claim 4, wherein:

when said barrier metal layer is formed on said insulating film, said concave portion is continuously or intermittently formed along said groove within a predetermined interval which is located between said concave portion and said groove maintains the shape of said groove.

6. A method of manufacturing a semiconductor device according to claim 4, wherein:

said groove is set as the one provided at the end of a group of grooves composed of plural grooves respectively arranged at a predetermined interval; and when said barrier metal layer is formed on said insulating film, said concave portion is continuously or intermittently formed along the groove provided at the end of said group of grooves within a predetermined interval which between said concave portion and the groove provided at the end of said group of grooves keeps the shape of the groove provided at the end of said group of grooves.

7. A method of manufacturing a semiconductor device having a process for forming a first insulating film on a substrate, a process for forming a contact hole through said first insulating film, a process for forming a second insulating film made of organic material on said first insulating film, embedding the organic material in said contact hole, a process for forming a groove through said second insulating film and forming said contact hole again, a process for forming a barrier metal layer at least on each inner wall of said groove and said contact hole, a process for embedding conductive material inside said groove and said contact hole via said barrier metal layer and a process for removing surplus conductive material and a surplus barrier metal layer on said second insulating film, wherein:

when said contact hole is formed through said first insulating film, a first concave portion is formed through said first insulating film in a position apart by a predetermined distance from said contact hole around a part located under a groove formed through said second insulating film; and when said second insulating film is formed, a second concave portion is formed on the surface of said second insulating film on said first concave portion.

8. A method of manufacturing a semiconductor device according to claim 7, wherein:

when said barrier metal layer is formed on said second insulating film, said second concave portion is continuously or intermittently formed along said groove within a predetermined interval which between the second concave portion and said second concave portion keeps the shape of said groove.

9. A method of manufacturing a semiconductor device according to claim 7, wherein:

said groove is set as the one provided at the end of a group of grooves composed of plural grooves respectively arranged at a predetermined interval; and when said barrier metal layer is formed on said second insulating film, said concave portion is continuously or intermittently formed along the groove provided at the end of said group of grooves within a predetermined interval which between the concave portion and the groove provided at the end of said group of grooves keeps the shape of the groove provided at the end of said group of grooves.

10. A semiconductor device according to claim 1 wherein said concave portion relaxes compressive stress of the barrier metal layer sufficient to inhibit the deformation of the groove.

11. A semiconductor device according to claim 1 wherein said concave portion is structured not to contribute as an interconnection of the device.

12. A semiconductor device according to claim 1, wherein said concave portion is formed in a position where its distance from a grooved interconnection is within 20 times of the width w of the groove.

13. A semiconductor device having a groove formed through an insulating film made of organic material on a substrate, a barrier metal layer formed at least on an interconnection embedded inside said groove via said barrier layer, including:

means having a concave portion formed around said interconnection through said insulating film for inhibiting a compressive stress possessed by said barrier metal layer from deforming a shape of said groove.

* * * * *